United States Patent
Yamazaki et al.

(10) Patent No.: US 10,451,912 B2
(45) Date of Patent: Oct. 22, 2019

(54) DISPLAY DEVICE, INPUT/OUTPUT DEVICE, AND DATA PROCESSING DEVICE

(71) Applicant: Semiconductor Energy Laboratory Co., Ltd., Kanagawa-ken (JP)

(72) Inventors: Shunpei Yamazaki, Tokyo (JP); Hisao Ikeda, Kanagawa (JP); Fumito Isaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 104 days.

(21) Appl. No.: 15/647,787

(22) Filed: Jul. 12, 2017

(65) Prior Publication Data
US 2018/0017818 A1    Jan. 18, 2018

(30) Foreign Application Priority Data
Jul. 15, 2016 (JP) .................... 2016-140018

(51) Int. Cl.
*G02F 1/1335* (2006.01)
*G02F 1/136* (2006.01)
(Continued)

(52) U.S. Cl.
CPC ........ *G02F 1/133504* (2013.01); *G02F 1/136* (2013.01); *G02F 1/133512* (2013.01);
(Continued)

(58) Field of Classification Search
CPC ......... G09G 2330/028; G09G 2330/02; G09G 2330/00; G09G 2320/0693;
(Continued)

(56) References Cited

U.S. PATENT DOCUMENTS

| 6,714,268 B2 | 3/2004 | Wang et al. |
| 7,038,641 B2 | 5/2006 | Hirota et al. |

(Continued)

FOREIGN PATENT DOCUMENTS

| JP | 2001-066593 A | 3/2001 |
| JP | 2002-196702 A | 7/2002 |

(Continued)

OTHER PUBLICATIONS

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

(Continued)

*Primary Examiner* — Julie Anne Watko
(74) *Attorney, Agent, or Firm* — Husch Blackwell LLP

(57) ABSTRACT

A display device includes a display panel and a control portion. The control portion has a function of receiving image data, and a function of generating and supplying first data and second data on the basis of the image data. The display panel includes a pixel and an optical element. The pixel includes a first display element and a second display element. The second display element includes a region adjacent to the first display element. The optical element includes a first region overlapping with the second display element. The first region has a function of directing light which enters a region overlapping with the second display element to the first display element. The first display element is a reflective display element. The second display element is a light-emitting element.

22 Claims, 21 Drawing Sheets

(51) Int. Cl.
*H01L 27/32* (2006.01)
*G02F 1/1362* (2006.01)
*H01L 27/28* (2006.01)
*G02F 1/1333* (2006.01)

(52) U.S. Cl.
CPC ........ *H01L 27/326* (2013.01); *G02F 1/13338* (2013.01); *G02F 1/133502* (2013.01); *G02F 1/136286* (2013.01); *G02F 2201/44* (2013.01); *G09G 2300/0456* (2013.01); *H01L 27/286* (2013.01)

(58) Field of Classification Search
CPC ....... G09G 2320/10; G09G 2320/0686; G09G 2320/0666; G09G 2320/068; G09G 2320/0626; G09G 2320/04; G09G 2320/02; G09G 2320/0233; G09G 2320/0242; G09G 2320/0238; G09G 2320/00; G09G 2330/027; G09G 2330/023; G09G 2330/021; G09G 2320/0646; G09G 2320/232; G09G 2320/0633; G09G 2320/06; G09G 2310/0291; G09G 2310/0281; G09G 2310/0264; G09G 2310/0243; G09G 2310/231; G09G 2310/0245; G09G 2310/0262; G09G 2310/02; G09G 2310/00; G09G 2300/0456; G09G 2300/0452; G09G 2310/0278; G09G 2310/0289; G09G 2310/027; G09G 3/2092; G09G 2300/0809; G09G 2300/0819; G09G 2300/088; G09G 2310/0885; G09G 2300/089; G09G 2300/23; G09G 2300/0895; G09G 2300/08; G09G 2300/0469; G09G 2300/0473; G09G 2300/0439; G09G 2300/0443; G09G 3/364; G09G 3/3611; G09G 3/3648; G09G 3/38; G09G 3/34; G09G 3/3466; G09G 3/3473; G09G 3/3413; G09G 3/3406; G09G 230/0404; G09G 2300/04; G09G 2300/00; G06F 1/3262; G06F 1/3265; G06F 1/325; G06F 1/3234; G06F 1/3206; G06F 1/3203; G06F 1/32; G06F 1/26; G06F 1/1613; G06F 1/00; G02F 1/136; G02F 1/136222; G02F 1/136227; G02F 1/133502; G02F 2001/133521; G02F 1/133512; G02F 1/136286; G02F 2001/136295; G02F 1/133504; G02F 2001/133507; G02F 2201/44; G02F 2201/00; G02F 2300/0456; G02F 2300/0439; G02F 1/136259; G02F 1/136209; G02F 2001/1352; G02F 2001/1351; G02F 2001/133504; G02F 2001/13335; G02F 1/133514; G02F 1/13338; G02F 1/13476; G02F 1/13473; G02F 1/1347; G02F 1/1323; G02F 1/1333; G02F 1/1326; G02F 1/13; G02F 1/01; G02F 1/00; H01L 27/326; H01L 27/3244; H01L 27/3267; H01L 27/3251; H01L 27/3225; H01L 27/3234; H01L 27/146; H01L 27/323; H01L 27/3232; H01L 27/3237; H01L 27/322; H01L 27/3206; H01L 27/30; H01L 27/28; H01L 27/00; H01L 27/286
See application file for complete search history.

(56) References Cited

U.S. PATENT DOCUMENTS

| | | | |
|---|---|---|---|
| 7,084,936 | B2 | 8/2006 | Kato |
| 7,102,704 | B2 | 9/2006 | Mitsui et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,385,654 | B2 | 6/2008 | Mitsui et al. |
| 2001/0053075 | A1* | 12/2001 | Parker ................ A61M 21/02 362/617 |
| 2003/0201960 | A1 | 10/2003 | Fujieda |
| 2006/0072047 | A1* | 4/2006 | Sekiguchi ............ G02F 1/1335 349/25 |
| 2006/0091397 | A1* | 5/2006 | Akimoto ............ H01L 27/3244 257/72 |
| 2006/0091399 | A1* | 5/2006 | Lee .................... H01L 27/12 257/72 |
| 2006/0145161 | A1* | 7/2006 | Lee .................... G02F 1/13458 257/72 |
| 2008/0180618 | A1 | 7/2008 | Fujieda |
| 2010/0171905 | A1* | 7/2010 | Huang ............. G02F 1/133371 349/69 |
| 2011/0205468 | A1* | 8/2011 | Hirakata .......... G02F 1/133526 349/95 |
| 2012/0256895 | A1* | 10/2012 | Azumada ............ G09G 3/3611 345/211 |
| 2014/0042397 | A1* | 2/2014 | Cho .................... H01L 51/0001 257/40 |
| 2014/0054562 | A1* | 2/2014 | Lee .................... H01L 27/124 257/40 |
| 2014/0132872 | A1* | 5/2014 | Kimura ................ B82Y 20/00 349/43 |
| 2017/0039931 | A1* | 2/2017 | Kubota ................ G09G 5/363 |
| 2018/0158882 | A1* | 6/2018 | Kim .................... H01L 27/3213 |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2011-191750 | 9/2011 |
| JP | 2013-221965 A | 10/2013 |
| WO | WO 2004-053819 A1 | 6/2004 |

OTHER PUBLICATIONS

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

Shieh, H-P., "Transflective Display by Hybrid OLED and LCD," LEOS 2005 (IEEE Lasers and Electro-Optics Society Annual Meeting), Oct. 22, 2005, pp. 650-651, IEEE.

Lee, J-H. et al., "High Ambient-Contrast-Ratio Display Using Tandem Reflective Liquid Crystal Display and Organic Light-Emitting Device," Optics Express, Nov. 14, 2005, vol. 13, No. 23, pp. 9431-9438.

* cited by examiner

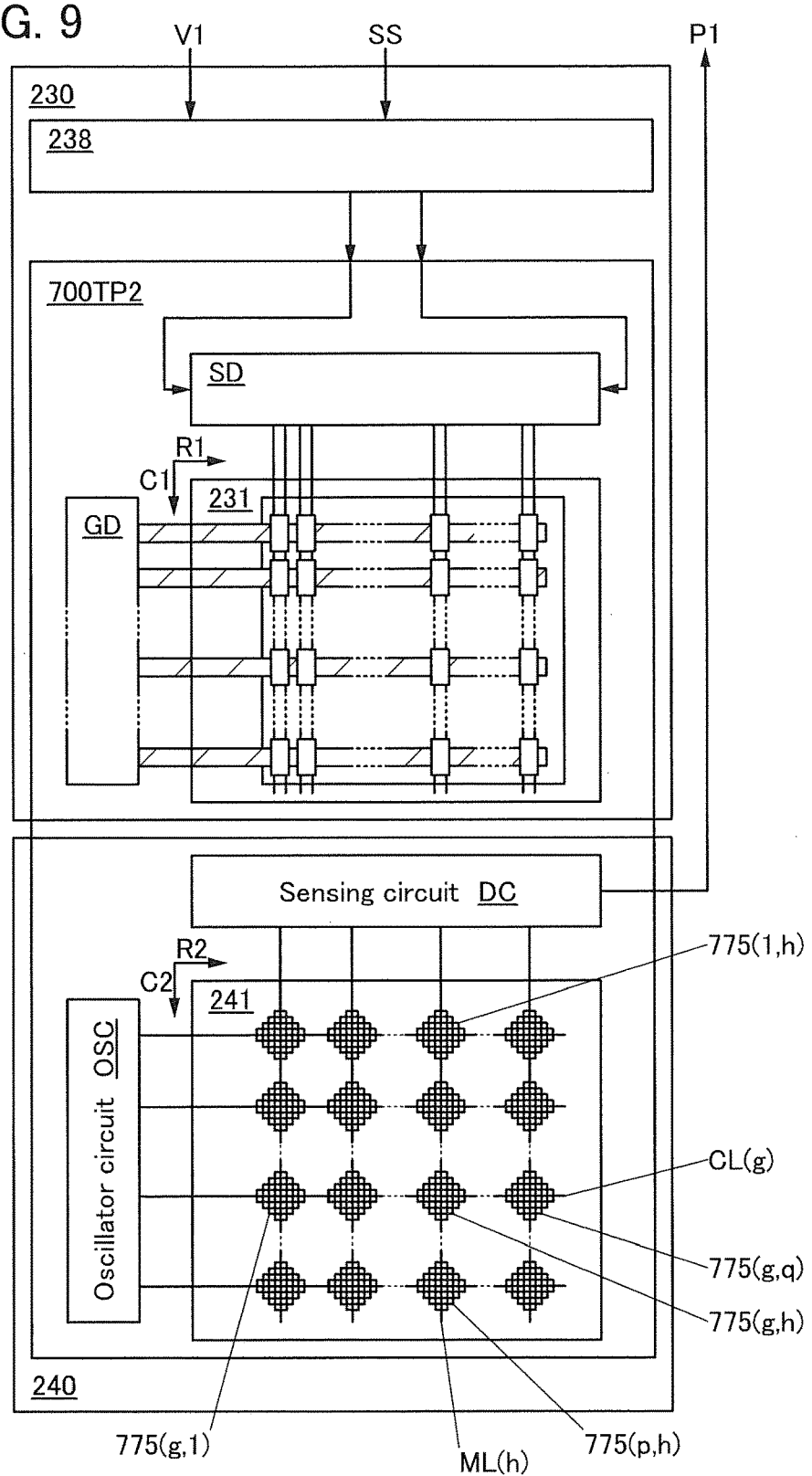

DISPLAY DEVICE, INPUT/OUTPUT DEVICE, AND DATA PROCESSING DEVICE

TECHNICAL FIELD

One embodiment of the present invention relates to a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a light-condensing means and a pixel electrode are provided on the same surface side of a substrate and a region transmitting visible light in the pixel electrode is provided to overlap with an optical axis of the light-condensing means, and a liquid crystal display device which includes an anisotropic light-condensing means having a condensing direction X and a non-condensing direction Y that is along a longitudinal direction of a region transmitting visible light in the pixel electrode are known (Patent Document 1).

REFERENCE

Patent Document

[Patent Document 1] Japanese Published Patent Application No. 2011-191750

DISCLOSURE OF INVENTION

An object of one embodiment of the present invention is to provide a novel display device that is highly convenient or reliable. Another object is to provide a novel input/output device that is highly convenient or reliable. Another object is to provide a novel data processor that is highly convenient or reliable. Another object is to provide a novel display device, a novel input/output device, a novel data processing device, or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a display device including a display panel and a control portion.

The control portion has a function of receiving image data and control data, a function of generating first data and second data on the basis of the image data, and a function of supplying the first data and the second data.

The display panel has a function of receiving the first data and the second data. The display panel includes a pixel and an optical element. The pixel includes a first display element and a second display element.

The second display element includes a region adjacent to the first display element. The optical element includes a first region overlapping with the second display element.

The first region has a function of directing light which enters a region overlapping with the second display element to the first display element.

The first display element has a function of displaying an image on the basis of the first data. The first display element is a reflective display element.

The second display element has a function of displaying an image on the basis of the second data. The second display element is a light-emitting element.

Thus, external light directed to the second display element can be directed to the first display element. Furthermore, an image displayed by the first display element can be made bright. Furthermore, reflection of external light by the second display element can be reduced. Consequently, a novel display device that is highly convenient or reliable can be provided.

(2) One embodiment of the present invention is a display device including a display panel and a control portion.

The control portion has a function of receiving image data and control data, a function of generating first data and second data on the basis of the image data, and a function of supplying the first data and the second data.

The display panel has a function of receiving the first data and the second data. The display panel includes a pixel and an optical element. The pixel includes a first display element, a second display element, and a coloring film.

The second display element includes a region overlapping with or adjacent to the first display element. The coloring film includes a region adjacent to the second display element.

The optical element includes a second region overlapping with the second display element. The second region has a function of directing light which enters a region overlapping with the second display element to the coloring film.

The first display element has a function of displaying an image on the basis of the first data. The first display element is a reflective display element.

The second display element has a function of displaying an image on the basis of the second data. The second display element is a light-emitting element.

Thus, external light directed to the second display element can be directed to the coloring film. Furthermore, reflection of external light due to the second display element can be reduced. Consequently, a novel display device that is highly convenient or reliable can be provided.

(3) One embodiment of the present invention is the display device in which the second region is shaped so as not to block light which enters the first display element.

Thus, the second region does not block external light directed to the first display element. Consequently, a novel display device that is highly convenient or reliable can be provided.

(4) One embodiment of the present invention is a display device including a display panel and a control portion.

The control portion has a function of receiving image data and control data, a function of generating first data and second data on the basis of the image data, and a function of supplying the first data and the second data. The display panel has a function of receiving the first data and the second data.

The display panel includes a pixel and an optical element. The pixel includes a first display element, a second display element, and a coloring film.

The coloring film includes a region adjacent to the first display element. The optical element includes a third region overlapping with the coloring film. The third region has a function of directing external light directed to a region overlapping with the coloring film to the first display element.

The first display element has a function of displaying an image on the basis of the first data. The first display element is a reflective display element.

The second display element has a function of displaying an image on the basis of the second data. The second display element is a light-emitting element.

Thus, external light which enters the third region can be directed to the first display element. Furthermore, an image displayed by the first display element can be made bright. Furthermore, external light which is directed to the coloring film can be utilized for displaying an image. Consequently, a novel display device that is highly convenient or reliable can be provided.

(5) One embodiment of the present invention is a display device described in any one of the above in which the optical element has a moth-eye structure on a surface.

Thus, reflection on a surface of the display panel can be reduced. Furthermore, light from the first display element or light from the second display element can be efficiently extracted. Consequently, a novel display device that is highly convenient or reliable can be provided.

(6) One embodiment of the present invention is the display device in which the pixel includes a first conductive film, a second conductive film, an insulating film, a pixel circuit, a first display element, and a second display element.

The second conductive film includes a region overlapping with the first conductive film.

The insulating film includes a region positioned between the first conductive film and the second conductive film. The insulating film has an opening.

The first conductive film is electrically connected to the first display element.

The second conductive film is electrically connected to the first conductive film in the opening. The second conductive film is electrically connected to the pixel circuit.

The second display element is electrically connected to the pixel circuit. The second display element has a function of emitting light toward the insulating film. The second display element is provided so that the display using the second display element can be seen from part of a region from which display using the first display element can be seen.

(7) One embodiment of the present invention is the above-described display device in which the display panel includes one group of pixels, another group of pixels, a scan line, and a signal line.

The one group of pixels include the pixel. The one group of pixels are arranged in a row direction.

The another group of pixels include the pixel. The another group of pixels are arranged in a column direction that intersects the row direction.

The scan line is electrically connected to the one group of pixels. The signal line is electrically connected to the another group of pixels.

Thus, the first display element and the second display element that displays an image using a method different from that of the first display element can be driven using pixel circuits that can be formed in the same process. Furthermore, using the insulating film, impurity diffusion between the first display element and the second display element or between the first display element and the pixel circuit can be suppressed. Consequently, a novel display device that is highly convenient or reliable can be provided.

(8) One embodiment of the present invention is an input/output device including the above-described display device and an input portion.

The input portion has a function of sensing an object that approaches a region overlapping with the display panel.

Thus, the object approaching the region overlapping with the display panel can be sensed while the image data is displayed by the display panel. As a result, a novel input/output device with high convenience or high reliability can be provided.

(9) One embodiment of the present invention is the above-described input/output device in which the input portion includes a region overlapping with the display panel. The input portion includes a control line, a sensing signal line, and a sensing element.

The control line has a function of supplying a control signal.

The sensing signal line has a function of receiving a sensing signal.

The sensing element is electrically connected to the control line and the sensing signal line. The sensing element has a light-transmitting property and includes a first electrode and a second electrode.

The first electrode is electrically connected to the control line.

The second electrode is electrically connected to the sensing signal line and is provided so that an electric field part of which is blocked by an object approaching the region overlapping with the display panel is generated between the second electrode and the first electrode.

The sensing element has a function of supplying the sensing signal which changes in accordance with the control signal and a distance between the sensing element and an object approaching a region overlapping with the display panel.

Thus, a finger or the like approaching the region overlapping with the display panel can be sensed while the image data is displayed by the display panel. As a result, a novel input/output device with high convenience or high reliability can be provided.

(10) One embodiment of the present invention is a data processing device including at least one of a keyboard, a hardware button, a pointing device, a touch sensor, an illuminance sensor, an imaging device, an audio input device, a viewpoint input device, and a posture determination device, and the above-described display device.

Thus, the arithmetic device can generate the image data or the control data on the basis of the data which is supplied using a variety of input devices. In addition, with the generated image data or control data, the power consumption can be reduced. Moreover, display with high visibility can be performed even in a bright place. As a result, a novel data processing device that is highly convenient or reliable can be provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

Note that in this specification, a source of a transistor means a source region that is part of a semiconductor film functioning as an active layer or a source electrode connected to the semiconductor film. Similarly, a drain of the transistor means a drain region that is part of the semiconductor film or a drain electrode connected to the semiconductor film. A gate means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel to each other means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, a connection state means not only a state of direct connection but also a state of indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

In addition, in this specification, one of a first electrode and a second electrode of a transistor refers to a source electrode and the other refers to a drain electrode.

According to one embodiment of the present invention, a novel display device that is highly convenient or reliable can be provided. A novel input/output device that is highly convenient or reliable can be provided. A novel data processing device which is highly convenient or reliable can be provided. A novel display device, a novel input/output device, a novel data processing device, or a novel semiconductor device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 9 is a block diagram illustrating a structure of an input/output device of one embodiment.

FIGS. 10A, 10B1, 10B2, and 10C illustrate structures of an input/output panel that can be used in an input/output device of one embodiment.

FIGS. 17A, 17B, 17C, 17D1, 17D2, 17E1, and 17E2 are top views and cross-sectional views illustrating structures of a reflective film of a display panel that can be used in a display device of an embodiment.

BEST MODE FOR CARRYING OUT THE INVENTION

Figure 1:
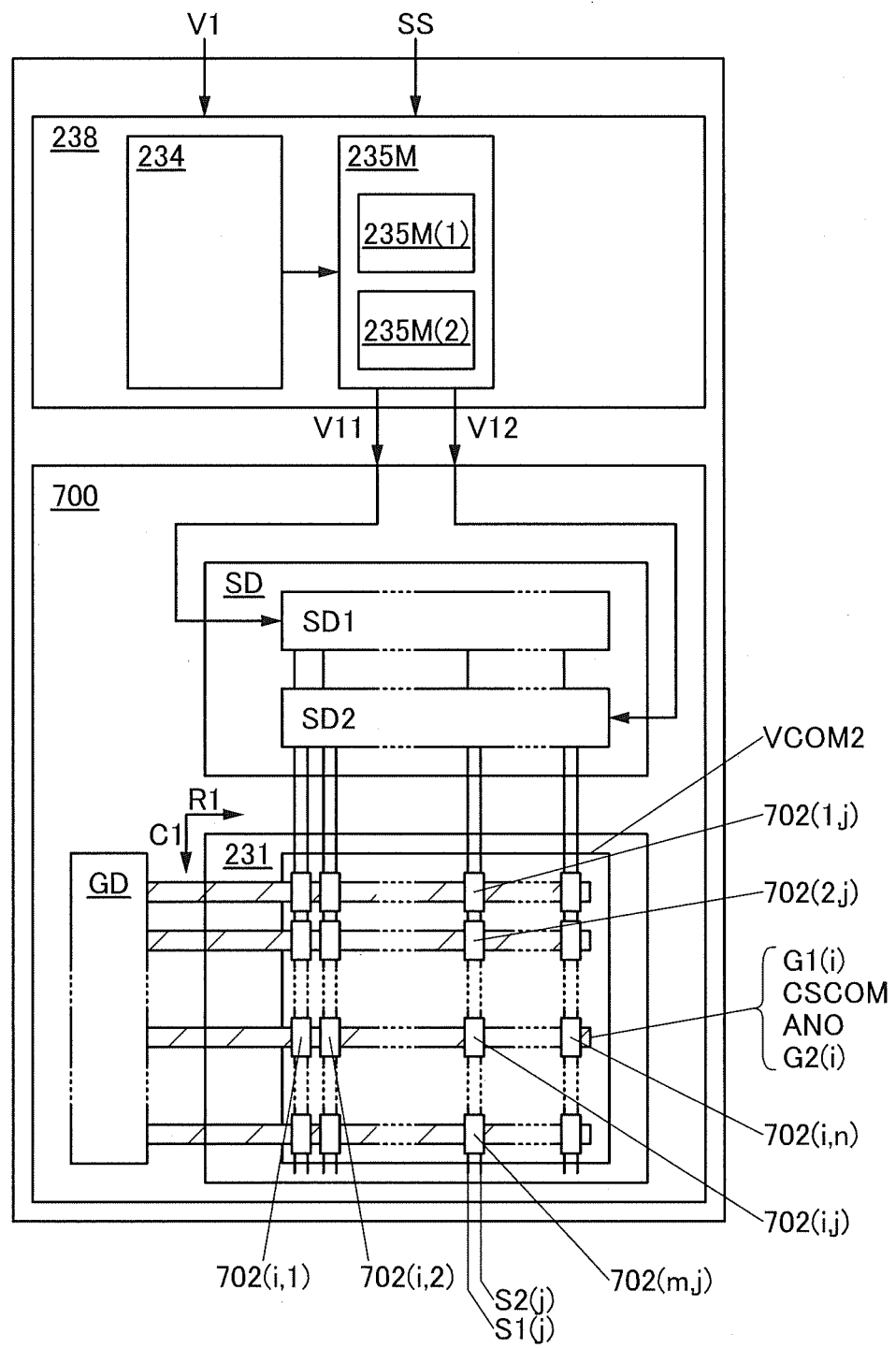
FIG. 1 is a block diagram illustrating the structure of a display device of one embodiment.

One embodiment of the present invention is a display device including a display panel and a control portion.

The control portion has a function of receiving image data and control data, a function of generating first data and second data on the basis of the image data, and a function of supplying the first data and the second data.

The display panel has a function of receiving the first data and the second data. The display panel includes a pixel and an optical element.

The pixel includes a first display element and a second display element.

The second display element includes a region adjacent to the first display element.

The optical element includes a first region overlapping with the second display element. The first region has a function of directing light which enters a region overlapping with the second display element to the first display element.

The first display element has a function of displaying an image on the basis of the first data. The first display element is a reflective display element.

The second display element has a function of displaying an image on the basis of the second data. The second display element is a light-emitting element.

Thus, external light directed to the second display element can be directed to the first display element. Furthermore, an image displayed by the first display element can be made bright. Furthermore, reflection of external light by the second display element can be reduced. Consequently, a novel display device that is highly convenient or reliable can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, a structure of a display device of one embodiment of the present invention will be described with reference to FIG. 1 and FIG. 2.

Figure 2:
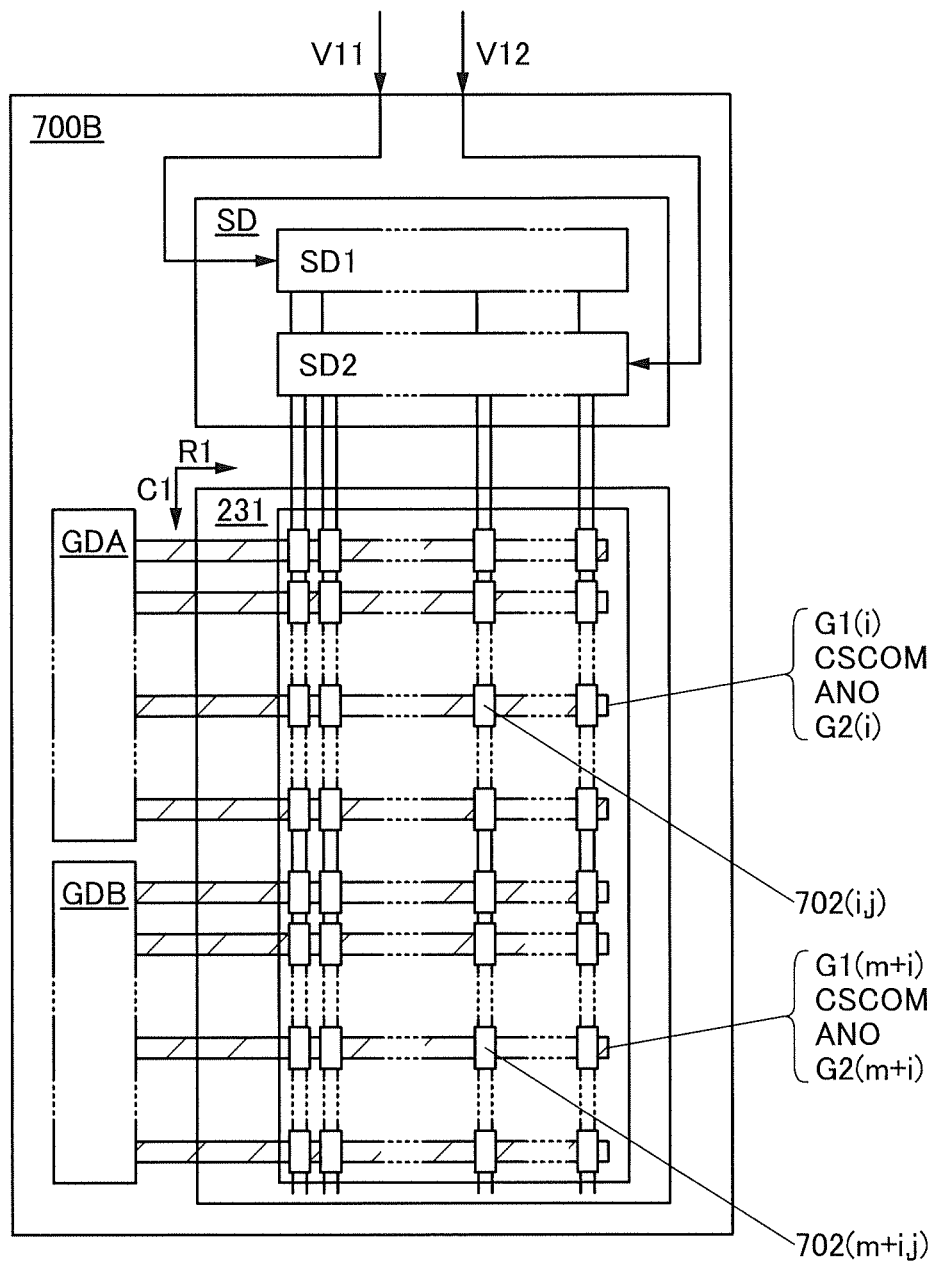
FIG. 2 is a block diagram illustrating a structure of a display portion in a data processing device of one embodiment.

FIG. 1 and FIG. 2 are block diagrams illustrating the structures of the display device of one embodiment of the present invention.

Note that in this specification, an integral variable of 1 or more may be used for reference numerals. For example, "(p)" where p is an integral value of 1 or more may be used for part of a reference numeral that specifies any one of components (p components in maximum). For another example, "(m, n)" where m and n are each an integral value of 1 or more may be used for part of a reference numeral that specifies any one of components (m×n components in maximum).

<Structure Example of Display Device>

The display device of one embodiment of the present invention includes a display panel 700 and a control portion 238 (see FIG. 1).

<<Control Portion 238>>

In addition, the control portion 238 has a function of receiving the image data V1 and control data SS.

The control portion 238 has a function of generating data V11 and data V12 on the basis of the image data V1. The control portion 238 has a function of supplying the data V11 and the data V12.

For example, the control portion 238 includes an expansion circuit 234 and an image processing circuit 235M.

<<Display Panel 700>>

The display panel 700 has a function of receiving the data V11 and the data V12. The display panel 700 includes a pixel 702(i, j) and an optical element 7000D (see FIG. 4A).

Figure 3A:
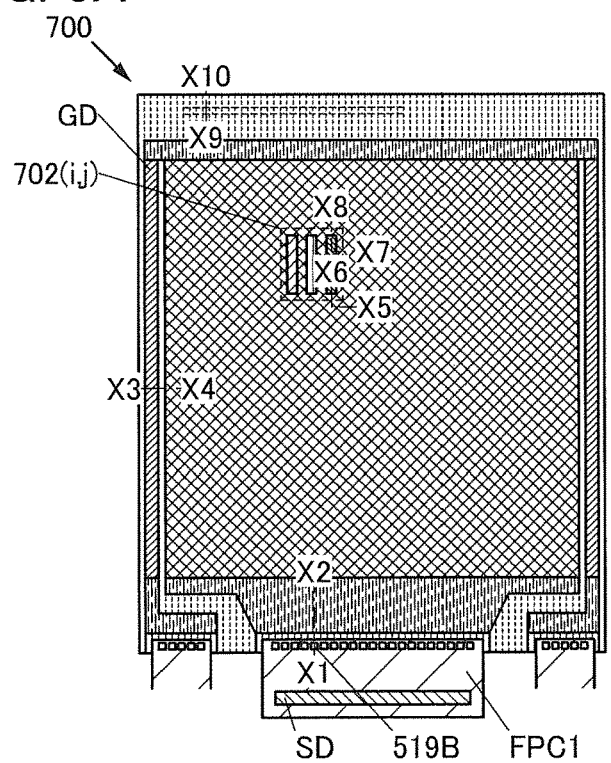
FIGS. 3A to 3C illustrate a structure of a display panel that can be used in a display device of one embodiment.
Figure 3B:
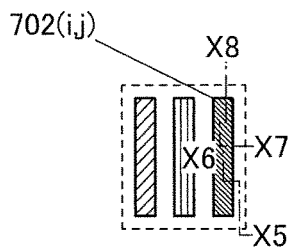
Figure 3C:
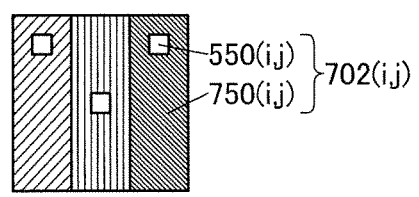

The pixel 702(i, j) includes a first display element 750(i, j) and a second display element 550(i, j) (see FIG. 3C).

The second display element 550 (i, j) includes a region overlapping with or adjacent to the first display element 750(i, j). Specifically, the second display element 550(i, j) includes a region overlapping with the first display element 750(i, j) (see FIG. 8C).

The optical element 7000D includes a region OD1 overlapping with the second display element 550(i, j). The region OD1 has a function of directing light L1 which enters a region overlapping with the second display element (i, j) to the first display element 750(i, j) (see FIG. 8C).

The first display element 750(i, j) has a function of displaying on the basis of the data V11. The first display element 750(i, j) is a reflective display element.

The second display element 550(i, j) has a function of displaying on the basis of the data V12. The second display element 550(i, j) is a light-emitting element.

The display panel described in Embodiment 2 can be used as the display panel 700, for example.

Thus, external light directed to the second display element can be directed to the first display element. Furthermore, an image displayed by the first display element can be made bright. Furthermore, reflection of external light by the second display element can be reduced. Consequently, a novel display device that is highly convenient or reliable can be provided.

<<Expansion Circuit 234>>

The expansion circuit 234 has a function of expanding the image data V1 which is supplied in a compressed state. The expansion circuit 234 includes a memory portion. The memory portion has a function of storing expanded image data, for example.

<<Image Processing Circuit 235M>>

The image processing circuit 235M includes a region 235M(1) and a region 235M(2), for example.

The region 235M(1) or the region 235M(2) has a function of storing data included in the image data V1, for example.

The image processing circuit 235M has a function of generating the data V11 by correcting the image data V1 on the basis of a predetermined characteristic curve and a function of supplying the data V11, for example. Specifically, the image processing circuit 235M has a function of generating the data V11 so that the first display element displays a high-quality image.

The image processing circuit 235M has a function of generating the data V12 by correcting the image data V1 on the basis of a predetermined characteristic curve and a function of supplying the data V12, for example. Specifically, the image processing circuit 235M has a function of generating the data V12 so that the second display element displays a high-quality image.

Note that this embodiment can be combined with any of the other embodiments in this specification as appropriate.

Embodiment 2

In this embodiment, the structure of the display panel 700 which can be used in the display device described in Embodiment 1 is described with reference to FIG. 1, FIG. 2, FIGS. 3A to 3C, FIGS. 4A and 4B, FIGS. 5A and 5B, FIGS. 6A and 6B, FIG. 7, FIGS. 8A to 8C, and FIGS. 17A, 17B, 17C, 17D1, 17D2, 17E1, and 17E2.

FIG. 1 is a block diagram illustrating the structure of the display device of one embodiment of the present invention. The display device includes a display panel.

FIG. 2 is a block diagram illustrating a structure of the display panel of one embodiment of the present invention. FIG. 2 is a block diagram illustrating a structure different from that in FIG. 1.

FIGS. 3A to 3C illustrate the structure of the display panel which can be used for the display device of one embodiment of the present invention. FIG. 3A is a top view of the display panel. FIG. 3B is a top view illustrating part of pixels of the display panel illustrated in FIG. 3A. FIG. 3C is a schematic view illustrating the structure of the pixel illustrated in FIG. 3B.

Figure 4A:
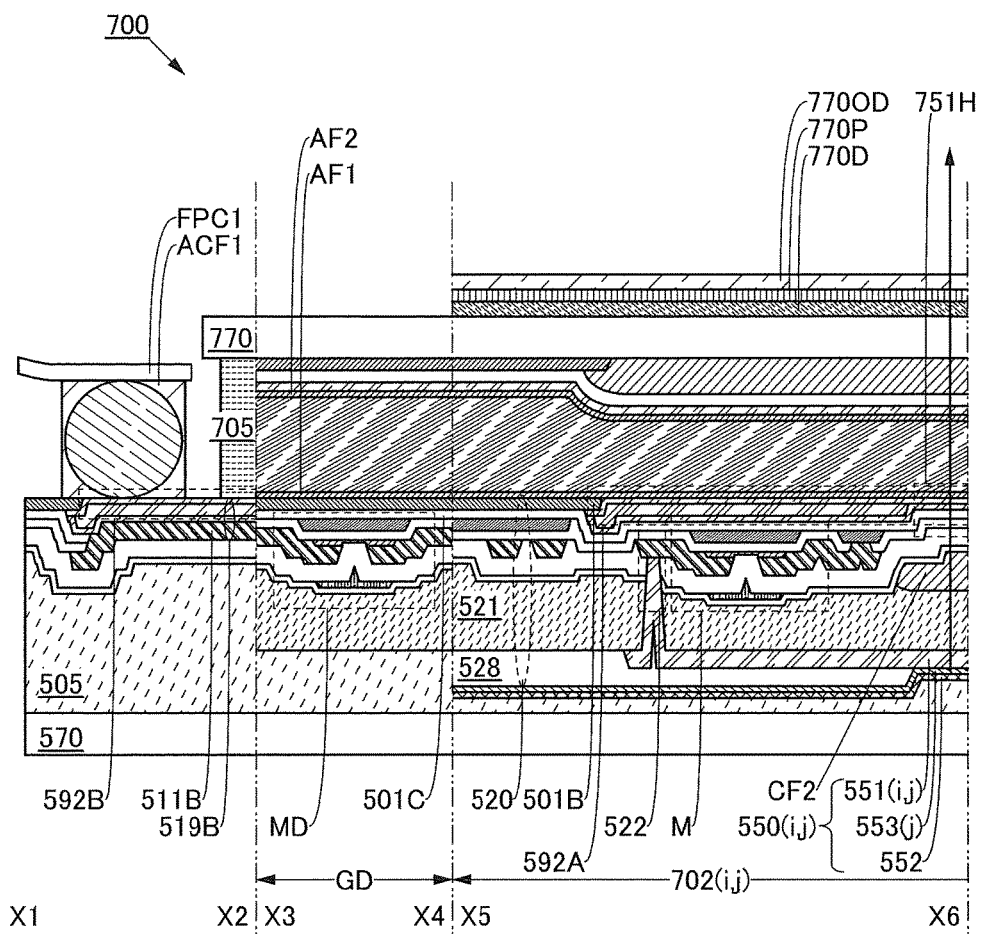
FIGS. 4A and 4B are cross-sectional views illustrating a structure of a display panel that can be used in a display device of one embodiment.
Figure 4B:
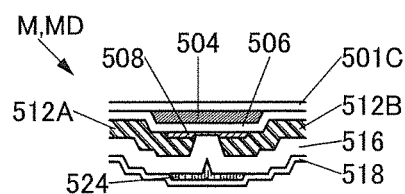

FIGS. 4A and 4B and FIGS. 5A and 5B are cross-sectional views illustrating the structure of the display panel. FIG. 4A is a cross-sectional view taken along cutting plane lines X1-X2, X3-X4, and X5-X6 in FIG. 3A. FIG. 4B illustrates part of FIG. 4A.

Figure 5A:
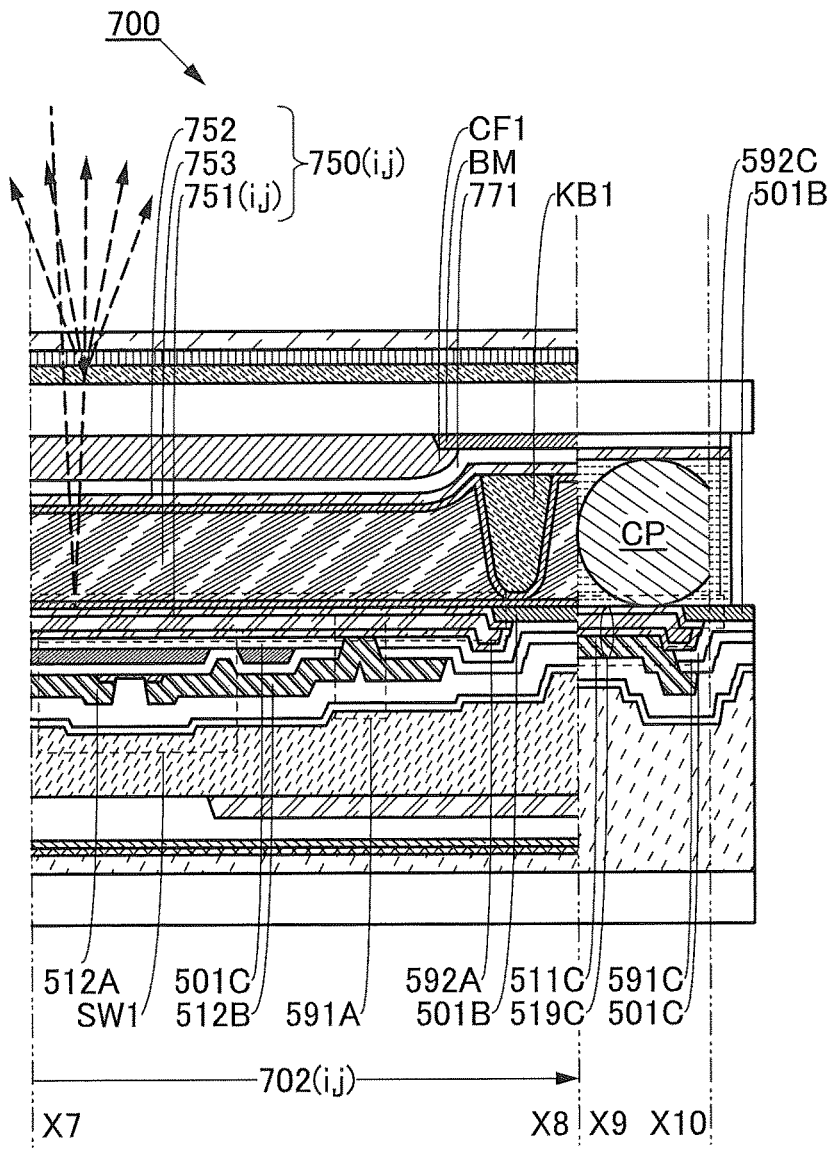
FIGS. 5A and 5B are cross-sectional views illustrating a structure of a display panel that can be used in a display device of one embodiment.
Figure 5B:
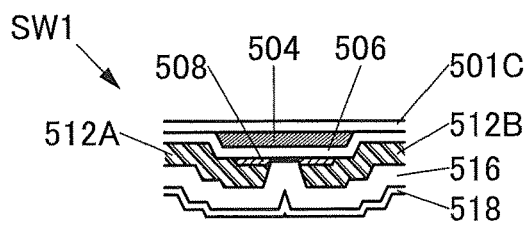

FIG. 5A is a cross-sectional view taken along cutting plane lines X7-X8 and X9-X10 in FIG. 3A. FIG. 5B illustrates part of FIG. 5A.

Figure 6A:
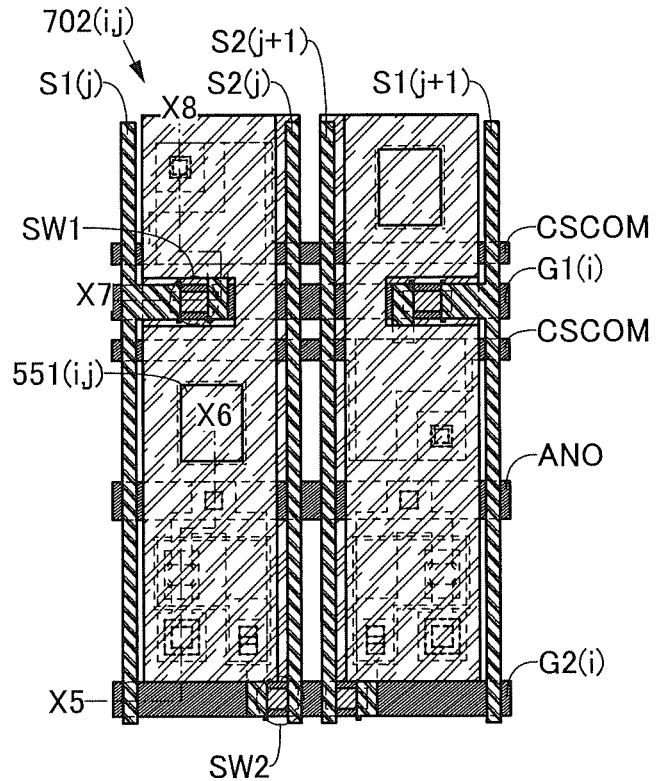
FIGS. 6A and 6B are bottom views illustrating a structure of a display panel that can be used in a display device of one embodiment.
Figure 6B:
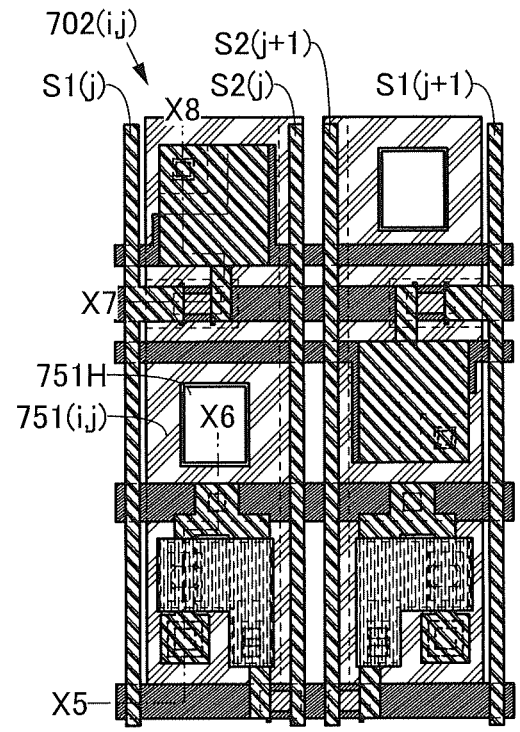

FIG. 6A is a bottom view illustrating part of pixels of the display panel in FIG. 3B. FIG. 6B is a bottom view illustrating part of the structure in FIG. 6A in which some components are omitted.

Figure 7:
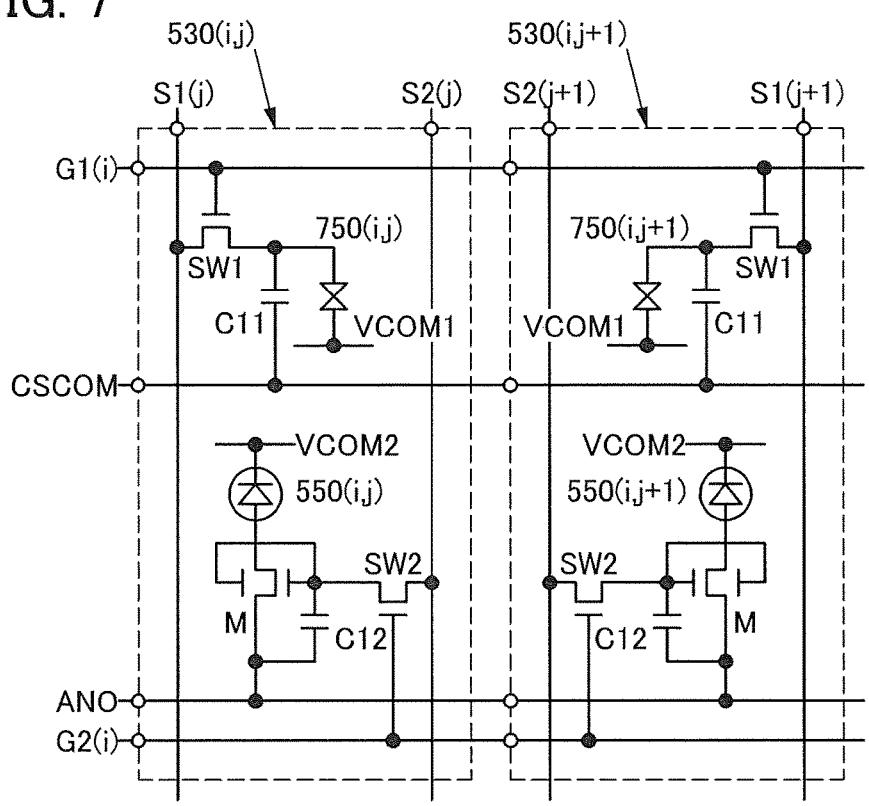
FIG. 7 is a circuit diagram illustrating a pixel circuit of a display panel that can be used in a display device of one embodiment.

FIG. 7 is a circuit diagram illustrating a structure of a pixel circuit included in a display panel of an embodiment of the present invention.

Figure 8A:
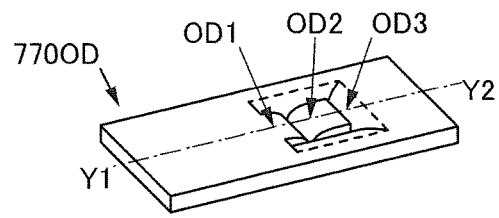
FIGS. 8A to 8C illustrate the shape of an optical element that can be used in a display device of one embodiment.
Figure 8B:
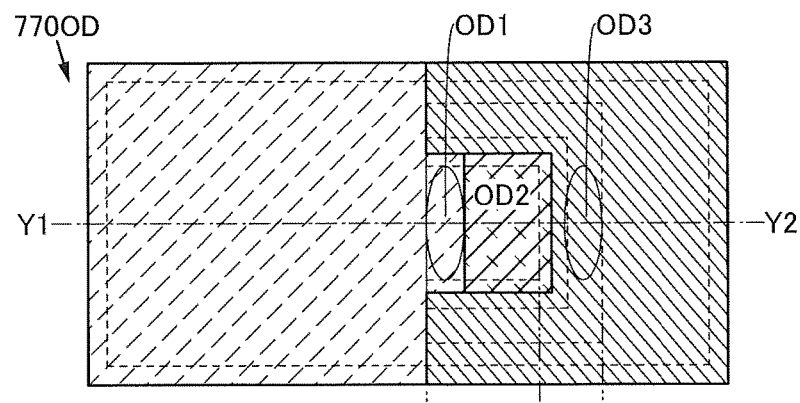
Figure 8C:
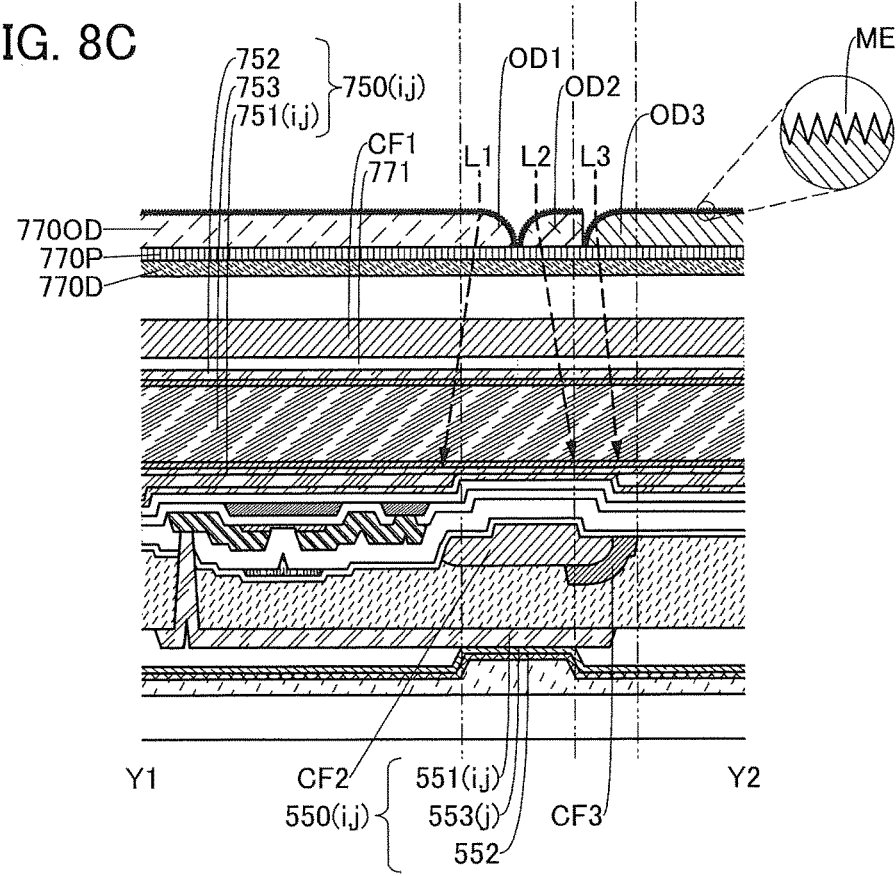

FIGS. 8A to 8C illustrate a structure of the optical element 7000D which can be used in the display panel of one embodiment of the present invention. FIG. 8A is a projection view of the optical element 7000D, FIG. 8B is a top view of the optical element 7000D, and FIG. 8C is a cross-sectional view of the optical element and the display panel taken along a cutting plane line Y1-Y2 in FIG. 8B.

Figure 17A:
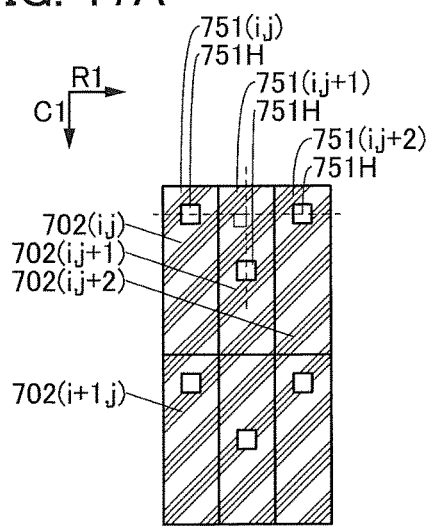
Figure 17B:
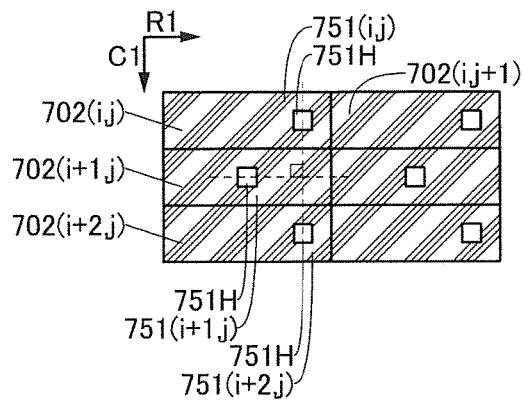
Figure 17C:
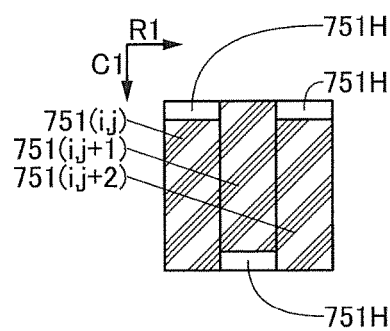
Figures 1, 17D:
Figures 1, 17E:
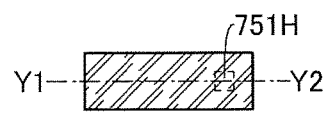
Figures 2, 17D:
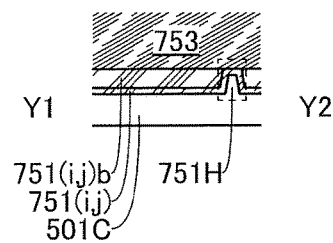
Figures 2, 17E:
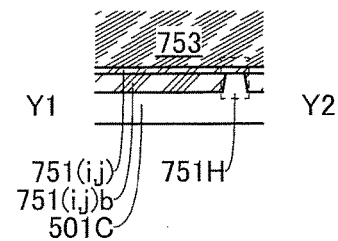

FIGS. 17A, 17B, 17C, 17D1, 17D2, 17E1, and 17E2 illustrate structures of reflective films which can be used in the display panel of one embodiment of the present invention. FIGS. 17A to 17C are schematic views of top surfaces of the reflective films. FIG. 17D1 is a top view of the reflective film. FIG. 17D2 is a cross-sectional view of the reflective film taken along a cutting plane line Y1-Y2 in FIG. 17D1. FIG. 17E1 is a top view of the reflective film which has a structure different from that of the reflective film shown in FIG. 17D1. FIG. 17E2 is a cross-sectional view of the reflective film taken along a cutting plane line Y1-Y2 in FIG. 17E1.

<Structure Example of Display Panel>

The display panel 700 of one embodiment of the present invention includes a display region 231 (see FIG. 1). Note that the display panel 700 includes a driving circuit GD or a driving circuit SD.

A display panel can include a plurality of driver circuits. For example, a display panel 700B includes a driver circuit GDA and a driver circuit GDB (see FIG. 2).

<<Display Region 231>>

The display region 231 includes one group of pixels 702($i$, 1) to 702($i$, $n$), another group of pixels 702(1, $j$) to 702($m$, $j$), a scan line G1 ($i$), and a signal line S1($j$) (see FIG. 1 or FIG. 7). The display region 231 includes a scan line G2($i$), a wiring CSCOM, a conductive film ANO, and a signal line S2($j$). Note that i is an integer greater than or equal to 1 and less than or equal to m, j is an integer greater than or equal to 1 and less than or equal to n, and each of m and n is an integer greater than or equal to 1.

The one group of pixels 702($i$, 1) to 702($i$, $n$) include the pixel 702($i$, $j$) and are provided in the row direction (the direction indicated by the arrow R1 in the drawing).

The another group of pixels 702(1, j) to 702($m$, $j$) include the pixel 702($i$, $j$) and are provided in the column direction (the direction indicated by the arrow C1 in the drawing) that intersects the row direction.

The scan line G1($i$) and the scan line G2($i$) are electrically connected to the one group of pixels 702($i$, 1) to 702($i$, $n$) provided in the row direction.

The signal line S1($i$) and the signal line S2($j$) are electrically connected to the another group of pixels 702(1, j) to 702($m$, $j$) provided in the row direction.

<<Driver Circuit GD>>

The driver circuit GD has a function of supplying a selection signal based on the control data.

For example, the driver circuit GD has a function of supplying a selection signal to one scan line at a frequency of 30 Hz or higher, preferably 60 Hz or higher, in accordance with the control data. Accordingly, moving images can be smoothly displayed.

For example, the driver circuit GD has a function of supplying a selection signal to one scan line at a frequency of lower than 30 Hz, preferably lower than 1 Hz, further preferably less than once per minute, in accordance with the control data. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which a moving image are displayed than to a region on which a still image is displayed. Accordingly, a still image can be displayed in a region with reduced flickering, and moving images can be smoothly displayed in another region.

<<Driver Circuit SD>>

The driver circuit SD includes a driver circuit SD1 and a driver circuit SD2. The driver circuit SD1 has a function of supplying an image signal on the basis of the data V11. The driver circuit SD2 has a function of supplying an image signal on the basis of the data V12 (see FIG. 1).

The driver circuit SD1 or the driver circuit SD2 has a function of generating an image signal and a function of supplying the image signal to a pixel circuit electrically connected to a display element. Specifically, the driver circuit SD1 or the driver circuit SD2 has a function of generating a signal whose polarity is inverted. Thus, for example, a liquid crystal display element can be driven.

For example, any of a variety of sequential circuits, such as a shift register, can be used as the driver circuit SD.

For example, an integrated circuit in which the driver circuit SD1 and the driver circuit SD2 are integrated can be used as the driver circuit SD. Specifically, an integrated circuit formed on a silicon substrate can be used as the driver circuit SD.

An integrated circuit can be mounted on a terminal by a chip on glass (COG) method or a chip on film (COF) method, for example. Specifically, an anisotropic conductive film can be used to mount an integrated circuit on the terminal.

<Structure Example of Pixel>

The pixel 702($i$, $j$) includes the first display element 750($i$, $j$), the second display element 550($i$, $j$), and part of a functional layer 520 (see FIG. 3C, FIG. 4A, and FIG. 5A).

<<Functional Layer>>

The functional layer 520 includes a first conductive film, a second conductive film, an insulating film 501C, and a pixel circuit 530($i$, $j$) (see FIGS. 4A and 4B and FIG. 7). In addition, the functional layer 520 includes an insulating film 521, an insulating film 518, and an insulating film 516.

The functional layer 520 includes a region positioned between the substrate 570 and the substrate 770.

<<Insulating Film 501C>>

The insulating film 501C includes a region positioned between the first conductive film and the second conductive film and has an opening 591A (see FIG. 5A). In addition, the insulating film 501C has an opening 591C.

<<First Conductive Film>>

The first conductive film is electrically connected to the first display element. Specifically, the first conductive film is electrically connected to a first electrode 751($i$, $j$). For example, the first electrode 751($i$, $j$) of the first display element 750($i$, $j$) can be used as the first conductive film.

<<Second Conductive Film>>

The second conductive film includes a region overlapping with the first conductive film. The second conductive film is electrically connected to the first conductive film through the opening 591A. For example, the conductive film 512B can be used as the second conductive film. Note that the first conductive film electrically connected to the second conductive film in the opening 591A that is formed in the insulating film 501C can be referred to as a through electrode.

The second conductive film is electrically connected to the pixel circuit 530($i$, $j$). For example, a conductive film which functions as a source electrode or a drain electrode of a transistor used as a switch SW1 of the pixel circuit 530($i$, $j$) can be used as the second conductive film.

<<Pixel Circuit>>

The pixel circuit 530($i$, $j$) has a function of driving the first display element 750($i$, $j$) and the second display element 550($i$, $j$) (see FIG. 7).

Thus, the first display element and the second display element that displays an image using a method different from that of the first display element can be driven using pixel circuits that can be formed in the same process. Specifically, a reflective display element is used as the first display element, whereby the power consumption can be reduced. In addition, an image with high contrast can be favorably displayed in an environment with bright external light. In addition, the second display element which emits light is used, whereby an image can be favorably displayed in a dark environment. Furthermore, using the insulating film, impurity diffusion between the first display element and the second display element or between the first display element and the pixel circuit can be suppressed. Consequently, a novel display device that is highly convenient or reliable can be provided.

A switch, a transistor, a diode, a resistor, an inductor, a capacitor, or the like can be used in the pixel circuit 530 ($i$,$j$).

For example, one or a plurality of transistors can be used for a switch. Alternatively, a plurality of transistors connected in parallel, in series, or in combination of parallel connection and series connection can be used for a switch.

For example, the pixel circuit 530($i$, $j$) is electrically connected to the signal line S1($j$), the signal line S2($j$), the scan line G1($i$), the scan line G2($i$), the wiring CSCOM, and the third conductive film ANO (see FIG. 7). Note that the conductive film 512A is electrically connected to the signal line S1($j$) (see FIG. 5A and FIG. 7).

The pixel circuit 530($i$, $j$) includes the switch SW1 and a capacitor C11 (see FIG. 7).

The pixel circuit 530($i$, $j$) includes a switch SW2, a transistor M, and a capacitor C12.

For example, a transistor including a gate electrode electrically connected to the scan line G1($i$) and a first electrode electrically connected to the signal line S1($j$) can be used for the switch SW1.

The capacitor C11 includes a first electrode electrically connected to a second electrode of the transistor used as the switch SW1 and a second electrode electrically connected to the wiring CSCOM.

For example, a transistor including a gate electrode electrically connected to the scan line G2($i$) and a first electrode electrically connected to the signal line S2($j$) can be used for the switch SW2.

The transistor M includes a gate electrode electrically connected to the second electrode of the transistor used as the switch SW2 and includes a first electrode electrically connected to the third conductive film ANO.

Note that a transistor including a conductive film provided such that a semiconductor film is interposed between a gate electrode and the conductive film can be used as the transistor M. For example, as the conductive film, a conductive film electrically connected to a wiring that can supply the same potential as that of the gate electrode of the transistor M can be used.

The capacitor C12 includes a first electrode electrically connected to a second electrode of the transistor used as the switch SW2 and a second electrode electrically connected to the first electrode of the transistor M.

A first electrode of the first display element 750($i$, $j$) is electrically connected to the second electrode of the transistor used for the switch SW1. A second electrode of the first display element 750($i$, $j$) is electrically connected to a wiring VCOM1. This enables the first display element 750 to be driven.

Furthermore, the third electrode 551($i$, $j$) and the fourth electrode 552 of the second display element 550($i$, $j$) are electrically connected to the second electrode of the transistor M and the fourth conductive film VCOM2, respectively. This enables the second display element 550($i$, $j$) to be driven.

<<First Display Element 750($i$, $j$)>>

For example, a display element having a function of controlling transmission or reflection of light can be used as the first display element 750($i$, $j$). Specifically, a reflective liquid crystal display element can be used as the first display element 750($i$, $j$). Alternatively, a MEMS shutter display element, an optical interference type MEMS display element, or the like can be used as the display element. The use of a reflective display element can reduce power consumption of a display panel. A display element using a microcapsule method, an electrophoretic method, an electrowetting method, or the like can be used as the first display element 750($i$, $j$), for example.

The first display element 750($i$, $j$) includes the first electrode 751 ($i$, $j$), a second electrode 752, and a layer 753 containing a liquid crystal material. The second electrode 752 is positioned such that an electric field which controls the alignment of the liquid crystal material is generated between the second electrode 752 and the first electrode 751($i$, $j$) (see FIG. 4A and FIG. 5A).

The first display element 750($i$, $j$) includes an alignment film AF1 and an alignment film AF2. The alignment film AF2 includes a region provided so that a layer 753 containing a liquid crystal material is positioned between the alignment film AF2 and the alignment film AF1.

<<Second Display Element 550($i$, $j$)>>

The second display element 550($i$, $j$) has a function of emitting light toward the insulating film 501C (see FIG. 4A).

The second display element 550(i, j) is provided so that the display using the second display element 550(i, j) can be seen from part of a region from which the display using the first display element 750(i, j) can be seen. For example, dashed arrows shown in FIG. 5A denote the directions in which external light is incident on and reflected by the first display element 750(i, j) that displays image data by controlling the intensity of external light reflection. In addition, a solid arrow shown in FIG. 4A denotes the direction in which the second display element 550(i, j) emits light to the part of the region from which the display using the first display element 750(i, j) can be seen.

Accordingly, display using the second display element can be seen from part of the region where display using the first display element can be seen. Alternatively, users can see display without changing the attitude or the like of the display panel. Thus, a novel display panel that is highly convenient or reliable can be provided.

Figure 18A:
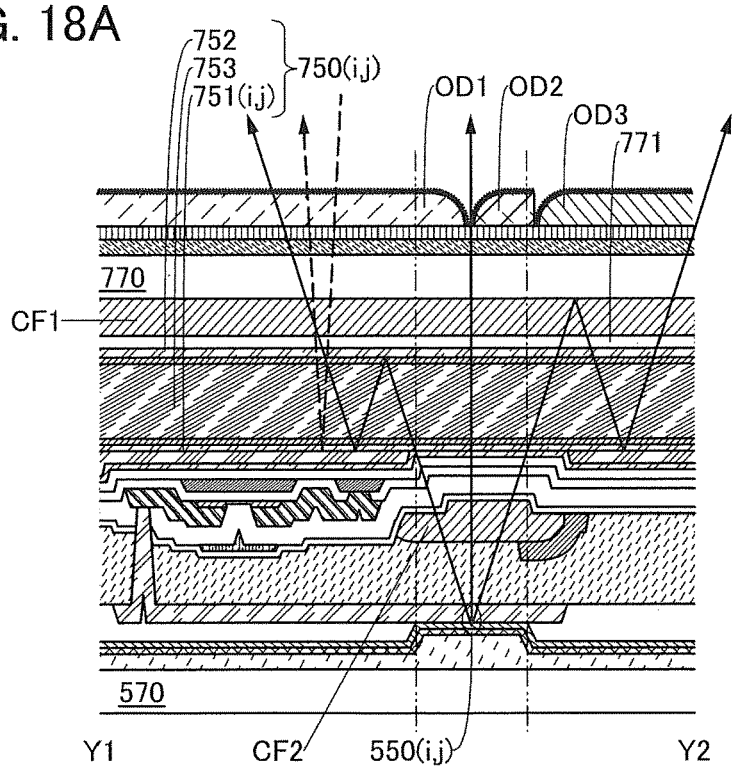
FIGS. 18A and 18B are cross-sectional views illustrating a display panel that can be used in a display device of one embodiment.

Note that part of light emitted from the second display element 550(i, j) passes through the layer 753 containing a liquid crystal material and is reflected by the substrate 770, the second electrode 752, or the like in some cases (see FIG. 18A). Reflection is repeated between the second electrode 752 and the first electrode 751 (i,j) in some cases, for example. Alternatively, reflection is repeated between the substrate 770 and the first electrode 751 (i, j) in some cases. Thus, image data can be displayed like indirect lighting with light emitted from the second display element. The second display element enables eye-friendly display. The second display element can display an image which gives less stress on eyes.

When the first display element 750(i, j) and the second display element 550(i, j) are used for the display of images, the color reflected by an object, the color emitted from an object, and the color of light reflected between the second electrode 752 and the first electrode 751 (i, j), or the like are mixed. Thus, a picture-like image can be displayed.

The second display element 550(i, j) includes a third electrode 551(i, j), a fourth electrode 552, and a layer 553(j) containing a light-emitting material (see FIG. 4A).

The fourth electrode 552 includes a region overlapping with the third electrode 551(i, j).

The layer 553(j) containing a light-emitting material includes a region positioned between the third electrode 551(i, j) and the fourth electrode 552.

The third electrode 551(i, j) is electrically connected to the pixel circuit 530(i, j) at a connection portion 522. Note that the third electrode 551(i, j) and the fourth electrode 552 are electrically connected to the third conductive film ANO and the fourth conductive film VCOM2, respectively (see FIG. 7).

<<Insulating Film 501B>>

The display panel described in this embodiment includes an insulating film 501B (see FIG. 4A).

The insulating film 501B has a first opening 592A, a second opening 592B, and an opening 592C (see FIG. 4A and FIG. 5A).

The first opening 592A includes a region overlapping with the first electrode 751(i, j) or a region overlapping with the insulating film 501C.

The second opening 592B includes a region overlapping with a conductive film 511B.

Furthermore, the opening 592C includes a region overlapping with a conductive film 511C.

<<Insulating Film 521, Insulating Film 528, Insulating Film 518, Insulating Film 516, and the Like>>

The insulating film 521 includes a region positioned between the pixel circuit 530(i, j) and the second display element 550(i, j).

The insulating film 528 includes a region positioned between the insulating film 521 and the substrate 570 and has an opening in a region overlapping with the second display element 550(i, j). The insulating film 528 formed along the periphery of the third electrode 551(i, j) can prevent a short circuit between the third electrode 551(i, j) and the fourth electrode.

The insulating film 518 includes a region positioned between the insulating film 521 and the pixel circuit 530(i, j).

The insulating film 516 includes a region positioned between the insulating film 518 and the pixel circuit 530(i, j).

<<Terminal and the Like>>

The display panel described in this embodiment includes a terminal 519B and a terminal 519C.

The terminal 519B includes the conductive film 511B. The terminal 519B is electrically connected to the signal line S1(j), for example.

The terminal 519C includes the conductive film 511C. The conductive film 511C is electrically connected to the wiring VCOM1, for example.

A conductive material CP is positioned between the terminal 519C and the second electrode 752, and has a function of electrically connecting the terminal 519C and the second electrode 752. For example, a conductive particle can be used as the conductive material CP.

<<Substrate and the Like>>

In addition, the display panel described in this embodiment includes the substrate 570 and the substrate 770.

The substrate 770 includes a region overlapping with the substrate 570. The substrate 770 includes a region provided so that the functional layer 520 is positioned between the substrate 770 and the substrate 570.

The substrate 770 includes a region overlapping with the first display element 750(i, j). For example, a material with low birefringence can be used for the region.

<<Bonding Layer, Sealant, Structure Body, and the Like>>

The display panel described in this embodiment also includes a bonding layer 505, a sealing material 705, and a structure body KB1.

The bonding layer 505 includes a region positioned between the functional layer 520 and the substrate 570, and has a function of bonding the functional layer 520 and the substrate 570 together.

The sealing material 705 includes a region positioned between the functional layer 520 and the substrate 770, and has a function of bonding the functional layer 520 and the substrate 770 together.

The structure body KB1 has a function of providing a certain space between the functional layer 520 and the substrate 770.

<<Functional Film and the Like>>

The display panel of one embodiment of the present invention includes a light-blocking film BM, an insulating film 771, a coloring film CF1, a coloring film CF2, and a coloring film CF3 (see FIG. 4A, FIG. 5A, and FIG. 8C).

The display panel includes a functional film 770P and a functional film 770D.

The light-blocking film BM has an opening in a region overlapping with the first display element 750(i, j).

The coloring film CF1 includes a region between the substrate 770 and the first display element 750(i, j).

The coloring film CF2 includes a region positioned between the insulating film 501C and the second display element 550(i, j) and a region overlapping with a region 751H which does not block light emitted from the second display element 550(i, j).

The coloring film CF3 includes a region adjacent to the second display element 550(i, j). The coloring film CF3 includes a region adjacent to the first display element 750(i, j). The coloring film CF3 has a function of absorbing incident light and reducing reflection. A material which has reflectivity lower than that of the second display element 550(i, j) can be used for the coloring film CF3, for example.

The insulating film 771 includes a region between the coloring film CF1 and the layer 753 containing a liquid crystal material or between the light-blocking film BM and the layer 753 containing a liquid crystal material. The insulating film 771 can reduce unevenness due to the thickness of the coloring film CF1. Alternatively, impurities can be prevented from being diffused from the light blocking film BM, the coloring film CF1, or the like to the layer 753 containing a liquid crystal material The functional film 770P includes a region overlapping with the first display element 750(i, j).

The functional film 770D includes a region overlapping with the first display element 750(i, j). The functional film 770D is provided so that a substrate 770 lies between the functional film 770D and the first display element 750(i, j). Thus, for example, light reflected by the first display element 750(i, j) can be diffused.

<<Optical Element 7000D>>

The display panel of one embodiment the present invention includes the optical element 7000D. The optical element 7000D includes a first region OD1, a second region OD2, and a third region OD3 (see FIGS. 8A to 8C).

The region OD1 has a function of directing light L1 which enters the region overlapping with the second display element 550(i, j) to the first display element 750(i, j) (see FIG. 8C). Thus, light directed to the second display element 550(i, j) can be utilized effectively using the first display element 750(i, j).

A region OD2 overlaps with the second display element 550(i, j) (see FIG. 8C). The region OD2 has a function of directing light L2 which enters a region overlapping with the second display element 550(i, j) to the coloring film CF3. The region OD2 is shaped so as not to block light entering the first display element 750(i, j) (see FIG. 8A or 8B). Thus, light directed to the second display element 550(i, j) can be absorbed by the coloring film CF3. Alternatively, external light reflected by the second display element 550(i, j) can be reduced. Alternatively, reduction in contrast due to reflection of external light can be suppressed.

A region OD3 overlaps with the coloring film CF3 (see FIG. 8C). The region OD3 has a function of directing light L3 which is directed toward a region overlapping with the coloring film CF3 to the first display element 750(i, j). Thus, light which enters the third region OD3 can be directed to the first display element 750(i, j). Furthermore, the display of the first display element 750(i, j) can be made bright. Furthermore, display can be performed utilizing external light which is directed to the coloring film CF3.

<Example of Components>

The display panel 700 includes the substrate 570, the substrate 770, the structure body KB1, the sealing material 705, or the bonding layer 505.

The display panel 700 includes the functional layer 520, the insulating film 521, or the insulating film 528.

The display panel 700 also includes the signal line S1(j), the signal line S2(j), the scan line G1(i), the scan line G2(i), the wiring CSCOM, or the third conductive film ANO.

The display panel 700 also includes the first conductive film or the second conductive film.

The display panel 700 also includes the terminal 519B, the terminal 519C, the conductive film 511B, or the conductive film 511C.

The display panel 700 includes the pixel circuit 530(i, j) or the switch SW1.

The display panel 700 also includes the first display element 750(i, j), the first electrode 751(i, j), the reflective film, the opening, the layer 753 containing a liquid crystal material, or the second electrode 752.

The display panel 700 includes the alignment film AF1, the alignment film AF2, the coloring film CF1, the coloring film CF2, the light-blocking film BM, the insulating film 771, the functional film 770P, the functional film 770D, or the optical element 7000D.

In addition, the display panel 700 includes the second display element 550(i, j), the third electrode 551(i, j), the fourth electrode 552, or the layer 553(j) containing a light-emitting material.

The display panel 700 includes the insulating film 501B and the insulating film 501C.

The display panel 700 includes the driver circuit GD or the driver circuit SD.

<<Substrate 570>>

The substrate 570 or the like can be formed using a material having heat resistance high enough to withstand heat treatment in the manufacturing process. For example, a material with a thickness greater than or equal to 0.1 mm and less than or equal to 0.7 mm can be used for the substrate 570. Specifically, a material polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramic, or metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium or the like, an SOI substrate, or the like can be used as the substrate 570 or the like. Thus, a semiconductor element can be provided over the substrate 570 or the like.

For example, an organic material such as a resin, a resin film, or plastic can be used for the substrate 570 or the like. Specifically, a resin film or a resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, an inorganic material, or the like into a resin film can be used for the substrate 570 or the like. For example, a composite material formed by dispersing a fibrous or particulate resin, an organic material, or the like into an inorganic material can be used for the substrate 570 or the like.

Furthermore, a single-layer material or a layered material in which a plurality of layers are stacked can be used for the substrate 570 or the like. For example, a layered material in which a base, an insulating film that prevents diffusion of impurities contained in the base, and the like are stacked can be used for the substrate 570 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 570 or the like. Alternatively, a layered material in which a resin and a film for preventing diffusion of impurities that penetrate the resin, such as a silicon oxide film, a silicon nitride film, or a silicon oxynitride film, are stacked can be used for the substrate 570 or the like.

Specifically, a resin film, a resin plate, a layered material, or the like of polyester, polyolefin, polyamide, polyimide, polycarbonate, an acrylic resin, or the like can be used for the substrate 570 or the like.

Specifically, a material including polyester, polyolefin, polyamide (e.g., nylon or aramid), polyimide, polycarbonate, polyurethane, an acrylic resin, an epoxy resin, or a resin having a siloxane bond, such as silicone, can be used for the substrate 570 or the like.

Specifically, polyethylene terephthalate (PET), polyethylene naphthalate (PEN), polyethersulfone (PES), acrylic, or the like can be used for the substrate 570 or the like. Alternatively, a cyclo olefin polymer (COP), a cyclo olefin copolymer (COC), or the like can be used.

Alternatively, paper, wood, or the like can be used for the substrate 570 or the like.

For example, a flexible substrate can be used as the substrate 570 or the like.

Note that a transistor, a capacitor, or the like can be directly formed on the substrate. Alternatively, a transistor, a capacitor, or the like formed on a substrate for use in manufacturing processes which can withstand heat applied in the manufacturing process can be transferred to the substrate 570 or the like. Thus, a transistor, a capacitor, or the like can be formed over a flexible substrate, for example.

<<Substrate 770>>

For example, a material that can be used for the substrate 570 can be used for the substrate 770. For example, a light-transmitting material that can be used for the substrate 570 can be used for the substrate 770. Specifically, a material with low birefringence that can be used for the substrate 570 can be used for the substrate 770.

For example, aluminosilicate glass, tempered glass, chemically tempered glass, sapphire, or the like can be favorably used for the substrate 770 that is on a side closer to a user of the display panel. This can prevent breakage or damage of the display panel caused by the use.

For example, a resin film of a cyclo olefin polymer (COP), a cyclic olefin copolymer (COC), or triacetyl cellulose (TAC) can be favorably used as the substrate 770. As a result, the substrate 770 can be light-weight. Alternatively, for example, the display device can be made less likely to suffer from damage by dropping or the like.

A material with a thickness greater than or equal to 0.1 mm and less than or equal to 0.7 mm can be also used for the substrate 770, for example. Specifically, a substrate polished for reducing the thickness can be used. In that case, the functional film 770D can be close to the first display element 750($i, j$). As a result, image blur can be reduced and an image can be displayed clearly.

<<Structure Body KB1>>

The structure body KB1 or the like can be formed using an organic material, an inorganic material, or a composite material of an organic material and an inorganic material. Accordingly, a predetermined space can be provided between components between which the structure body KB1 and the like are provided.

Specifically, for the structure body KB1, polyester, polyolefin, polyamide, polyimide, polycarbonate, polysiloxane, an acrylic resin, or the like, or a composite material of a plurality of resins selected from these can be used. Alternatively, a photosensitive material may be used.

<<Sealing Material 705>>

For the sealing material 705 or the like, an inorganic material, an organic material, a composite material of an inorganic material and an organic material, or the like can be used.

For example, an organic material such as a thermally fusible resin or a curable resin can be used for the sealing material 705 or the like.

For example, an organic material such as a reactive curable adhesive, a light curable adhesive, a thermosetting adhesive, and/or an anaerobic adhesive can be used for the sealing material 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used for the sealing material 705 or the like.

<<Bonding Layer 505>>

For example, any of the materials that can be used for the sealing material 705 can be used for the bonding layer 505.

<<Insulating Film 521>>

For example, an insulating inorganic material, an insulating organic material, or an insulating composite material containing an inorganic material and an organic material can be used for the insulating film 521 or the like.

Specifically, for example, an inorganic oxide film, an inorganic nitride film, an inorganic oxynitride film, or a material obtained by stacking any of these films and the like can be used as the insulating film 521 or the like. For example, a silicon oxide film, a silicon nitride film, a silicon oxynitride film, an aluminum oxide film, or a film including a stack of any of these films and the like can be used as the insulating film 521 or the like.

Specifically, for the insulating film 521 or the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating film 521, for example, can be reduced.

<<Insulating Film 528>>

For example, any of the materials that can be used for the insulating film 521 can be used for the insulating film 528 or the like. Specifically, a 1-μm-thick polyimide-containing film can be used as the insulating film 528.

<<Insulating Film 501B>>

For example, a material which can be used for the insulating film 521 can be used for the insulating film 501B. For example, a material having a function of supplying hydrogen can be used for the insulating film 501B.

Specifically, a material obtained by stacking a material containing silicon and oxygen and a material containing silicon and nitrogen can be used for the insulating film 501B. For example, a material having a function of releasing hydrogen by heating or the like to supply the hydrogen to another component can be used for the insulating film 501B. Specifically, a material having a function of releasing hydrogen taken in the manufacturing process, by heating or the like, to supply the hydrogen to another component can be used for the insulating film 501B.

For example, a film containing silicon and oxygen that is formed by a chemical vapor deposition method using silane or the like as a source gas can be used as the insulating film 501B.

Specifically, a material obtained by stacking a material containing silicon and oxygen and having a thickness of more than or equal to 200 nm and less than or equal to 600 nm and a material containing silicon and nitrogen and having a thickness of approximately 200 nm can be used for the insulating film 501B.

<<Insulating Film 501C>>

For example, any of the materials that can be used for the insulating film 521 can be used for the insulating film 501C. Specifically, a material containing silicon and oxygen can be used for the insulating film 501C. Thus, diffusion of impurities into the pixel circuit, the second display element, or the like can be inhibited.

For example, a 200-nm-thick film containing silicon, oxygen, and nitrogen can be used as the insulating film 501C.

<<Wiring, Terminal, and Conductive Film>>

A conductive material can be used for the wiring or the like. Specifically, the conductive material can be used for the signal line S1($j$), the signal line S2($j$), the scan line G1($i$), the scan line G2($i$), the wiring CSCOM, the third conductive film ANO, the terminal 519B, the terminal 519C, the conductive film 511B, the conductive film 511C, or the like.

For example, an inorganic conductive material, an organic conductive material, a metal, conductive ceramics, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film including graphene oxide is formed and is subjected to reduction, so that a film including graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conductive high molecular compound can be used for the wiring or the like.

Note that the terminal 519B can be electrically connected to a flexible printed circuit FPC1 using a conductive material ACF1, for example.

<<First Conductive Film and Second Conductive Film>>

For example, any of the materials that can be used for the wiring or the like can be used for the first conductive film or the second conductive film.

Alternatively, the first electrode 751($i$, $j$), the wiring, or the like can be used for the first conductive film.

The conductive film 512B functioning as the source electrode or the drain electrode of the transistor that can be used for the switch SW1, the wiring, or the like can be used for the second conductive film.

<<First Display Element 750($i$, $j$)>>

For example, a display element having a function of controlling transmission or reflection of light can be used as the first display element 750($i$, $j$). For example, a combined structure of a polarizing plate and a liquid crystal element or a MEMS shutter display element can be used. Specifically, a reflective liquid crystal display element can be used as the first display element 750($i$, $j$). The use of a reflective display element can reduce power consumption of a display panel.

For example, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 750($i$, $j$) includes a first electrode, a second electrode, and a layer containing a liquid crystal material. The layer containing a liquid crystal material contains a liquid crystal material whose orientation is controlled by voltage applied between the first electrode and the second electrode. For example, the orientation of the liquid crystal material can be controlled by an electric field in the thickness direction (also referred to as the vertical direction) or an electric field in the direction that intersects the vertical direction (also referred to as the horizontal direction or the diagonal direction) of the layer containing a liquid crystal material.

<<Liquid Crystal Layer 753>>

For example, thermotropic liquid crystal, low-molecular liquid crystal, high-molecular liquid crystal, polymer dispersed liquid crystal, ferroelectric liquid crystal, anti-ferroelectric liquid crystal, or the like can be used for the layer containing a liquid crystal material. Alternatively, a liquid crystal material which exhibits a cholesteric phase, a smectic phase, a cubic phase, a chiral nematic phase, an isotropic phase, or the like can be used. Alternatively, a liquid crystal material which exhibits a blue phase can be used.

<<First Electrode 751(i, j)>>

For example, the material that is used for the wiring or the like can be used for the first electrode 751(i, j). Specifically, a reflective film can be used for the first electrode 751(i, j). For example, a material in which a light-transmitting conductive film and a reflective film having an opening are stacked can be used for the first electrode 751(i,j).

<Reflective Film>

For example, a material that reflects visible light can be used for the reflective film. Specifically, a material containing silver can be used for the reflective film. For example, a material containing silver, palladium, and the like or a material containing silver, copper, and the like can be used for the reflective film.

The reflective film reflects light that passes through the layer 753 containing a liquid crystal material, for example. This allows the first display element 750 to serve as a reflective liquid crystal element. Alternatively, for example, a material with unevenness on its surface can be used for the reflective film. In that case, incident light can be reflected in various directions so that a white image can be displayed.

For example, the first conductive film, the first electrode 751(i, j), or the like can be used as a reflective film.

Alternatively, a film 751(i, j)b including a region positioned between the layer 753 containing a liquid crystal material and the first electrode 751(i, j) can be used as a reflective film (see FIG. 17D1 or FIG. 17D2). Alternatively, as the reflective film, the film 751(i, j)b including a region provided so that the first electrode 751 (i, j) having a light-transmitting property is positioned between the layer 753 containing a liquid crystal material and the first electrode 751(i, j) can be used (see FIG. 17E1 or FIG. 17E2).

The reflective film has a shape including the region 751H that does not block light emitted from the second display element 550(i, j), for example (see FIGS. 17A to 17C).

For example, the reflective film can have one or more openings. Specifically, the region 751H may have a polygonal shape, a quadrangular shape, an elliptical shape, a circular shape, a cross-like shape, or the like. The region 751H may also have a stripe shape, a slit-like shape, or a checkered pattern.

If the ratio of the total area of the region 751H to the total area of the reflective film is too large, an image displayed using the first display element 750(i, j) is dark.

If the ratio of the total area of the region 751H to the total area of the reflective film is too small, an image displayed using the second display element 550(i, j) is dark. The reliability of the second display element 550(i, j) may be degraded.

For example, the region 751H provided in the pixel 702(i, j+1) is not provided on a line that extends in the row direction (the direction indicated by the arrow R1 in the drawing) through the region 751H provided in the pixel 702(i, j) (see FIG. 17A). Alternatively, for example, the region 751H provided in the pixel 702(i+1, j) is not provided on a line that extends in the column direction (the direction indicated by the arrow C1 in the drawing) through the region 751H provided in the pixel 702(i, j) (see FIG. 17B).

For example, the region 751H provided in the pixel 702(i, j+2) is provided on a line that extends in the row direction through the region 751H provided in the pixel 702(i, j) (see FIG. 17A). In addition, the region 751H provided in the pixel 702(i, j+1) is provided on a line that is perpendicular to the above-mentioned line between the region 751H provided in the pixel 702(i, j) and the region 751H provided in the pixel 702(i, j+2).

Alternatively, for example, the region 751H provided in the pixel 702(i+2, j) is provided on a line that extends in the column direction through the region 751H provided in the pixel 702(i, j) (see FIG. 17B). In addition, for example, the region 751H provided in the pixel 702(i+1, j) is provided on a line that is perpendicular to the above-mentioned line between the region 751H provided in the pixel 702(i, j) and the region 751H provided in the pixel 702(i+2, j).

When the second display elements are provided to overlap with the regions that do not block light and are provided in the above manner, the second display element of another pixel adjacent to one pixel can be apart from a second display element of the one pixel. A display element which displays color different from that displayed from the second display element of one pixel can be provided as the second display element of another pixel adjacent to the one pixel. The difficulty in arranging a plurality of display elements displaying different colors adjacent to each other can be lowered. Thus, a novel display panel that is highly convenient or reliable can be provided.

The reflective film can have a shape in which an end portion is cut off so as to form the region 751H (see FIG. 17C). Specifically, the reflective film can have a shape in which an end portion is cut off so as to be shorter in the column direction (the direction indicated by the arrow C1 in the drawing).

<<Second Electrode 752>>

For example, a material which can be used for the wiring or the like can be used for the second electrode 752. For example, a material that has a light-transmitting property selected from materials that can be used for the wiring or the like can be used for the second electrode 752.

For example, a conductive oxide, a metal film thin enough to transmit light, a metal nanowire, or the like can be used for the second electrode 752.

Specifically, a conductive oxide containing indium can be used for the second electrode 752. Alternatively, a metal thin film with a thickness greater than or equal to 1 nm and less than or equal to 10 nm can be used for the second electrode 752. Alternatively, a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Alignment Films AF1 and AF2>>

The alignment films AF1 and AF2 can be formed using a material containing polyimide or the like, for example. Specifically, a material formed by rubbing treatment or an optical alignment technique such that a liquid crystal material has a predetermined alignment can be used.

For example, a film containing soluble polyimide can be used for the alignment films AF1 and AF2. In this case, the temperature required in forming the alignment film AF1 or AF2 can be low. As a result, damage to other components caused when the alignment film AF1 or the alignment film AF2 is formed can be reduced.

<<Coloring Films CF1 and CF2>>

A material that transmits light of a predetermined color can be used for the coloring film CF1 or the coloring film CF2. In that case, the coloring film CF1 or the coloring film CF2 can be used as a color filter, for example. For example, a material that transmits blue light, green light, or red light can be used for the coloring film CF1 or the coloring film CF2. Furthermore, a material that transmits yellow light, white light, or the like can be used for the coloring film CF1 or the coloring film CF2.

Note that a material having a function of converting the emitted light to a predetermined color light can be used for the coloring film CF2. Specifically, quantum dots can be used for the coloring film CF2. Thus, display with high color purity can be achieved.

<<Coloring Film CF3>>

For example, a material that suppresses light transmission can be used for the coloring film CF3. Thus, incident light can be absorbed and reflection of light can be inhibited. Specifically, a material which can be used for the light-blocking film BM can be used.

<<Light-Blocking Film BM>>

For example, a material that suppresses light transmission can be used for the light-blocking film BM. Thus, the light-blocking film BM can be used as, for example, a black matrix.

Specifically, a resin containing a pigment or dye can be used for the light-blocking film BM. For example, a resin in which carbon black is dispersed can be used for the blocking film.

Alternatively, an inorganic compound, an inorganic oxide, a composite oxide containing a solution of a plurality of inorganic compounds, or the like can be used for the light-blocking film BM. Specifically, a black chromium film, a film containing cupric oxide, or a film containing copper chloride or tellurium chloride can be used for the light-blocking film BM.

<<Insulating Film 771>>

The insulating film 771 can be formed of polyimide, epoxy resin, acrylic resin, or the like.

<<Functional Films 770P and 770D>>

An anti-reflection film, a polarizing film, a retardation film, a light diffusion film, a condensing film, or the like can be used for the functional film 770P or the functional film 770D, for example.

Specifically, a film containing a dichromatic pigment can be used for the functional film 770P or the functional film 770D. Alternatively, a material with a columnar structure having an axis along the direction intersecting a surface of a base can be used for the functional film 770P or the functional film 770D. In that case, light can be transmitted in the direction along the axis and scattered in other directions easily.

Alternatively, an antistatic film preventing the attachment of a foreign substance, a water repellent film suppressing the attachment of stain, a hard coat film suppressing a scratch in use, or the like can be used as the functional film 770P.

Specifically, a circularly polarizing film can be used for the functional film 770P. Furthermore, a light diffusion film can be used for the functional film 770D.

<<Second Display Element 550(i, j)>>

A display element having a function of emitting light can be used as the second display element 550(i, j), for example. Specifically, an organic electroluminescent element, an inorganic electroluminescent element, a light-emitting diode, a quantum-dot LED (QDLED), or the like can be used as the second display element 550(i, j).

For example, a light-emitting organic compound can be used for the layer 553(j) containing a light-emitting material.

For example, quantum dots can be used for the layer 553(j) containing a light-emitting material. Accordingly, the half width becomes narrow, and light of a bright color can be emitted.

A stacked-layer material for emitting blue light, green light, or red light can be used for the layer 553(j) containing a light-emitting material, for example.

For example, a belt-like layered material that extends in the column direction along the signal line S2(j) can be used for the layer 553(j) containing a light-emitting material.

Alternatively, a layered material for emitting white light can be used for the layer 553(j) containing a light-emitting material. Specifically, a layered material in which a layer containing a light-emitting material including a fluorescent material that emits blue light, and a layer containing a material that is other than a fluorescent material and that emits green light and/or red light or a layer containing a material that is other than a fluorescent material and that emits yellow light are stacked can be used for the layer 553(j) containing a light-emitting material.

For example, a material that can be used for the wiring or the like can be used for the third electrode 551(i, j).

For example, a material that transmits visible light among the materials that can be used for the wiring or the like can be used for the third electrode 551(i, j).

Specifically, conductive oxide, indium-containing conductive oxide, indium oxide, indium tin oxide, indium zinc oxide, zinc oxide, zinc oxide to which gallium is added, or the like can be used for the third electrode 551(i, j). Alternatively, a metal film that is thin enough to transmit light can be used as the third electrode 551(i, j). Further alternatively, a metal film that transmits part of light and reflects another part of light can be used for the third electrode 551(i, j). Accordingly, the second display element 550(i, j) can have a microcavity structure. As a result, light of a predetermined wavelength can be extracted more efficiently than light of other wavelengths.

For example, a material that can be used for the wiring or the like can be used for the fourth electrode 552. Specifically, a material that reflects visible light can be used for the fourth electrode 552.

<<Optical Element 7000D>>

A light-transmitting material is used for the optical element 7000D. For example, resin, glass, or the like can be used for the optical element 7000D. For example, a material that is used for the substrate 770 can be used for the optical element 7000D.

For example, a lens, a prism, or the like can be used as the optical element 7000D (see FIG. 8A, FIG. 8B, or FIG. 8C). Specifically, the optical element 7000D includes a curved surface or an inclined surface functioning as a lens, a prism, or the like in the region OD1, the region OD2, or the region OD3. For example, a lenticular lens can be used as the optical element 7000D.

For example, a fine structure with a period that is sufficiently shorter than the wavelength of incident light can be provided on a surface of the optical element 7000D.

Specifically, a moth-eye structure ME is provided on the surface of the optical element 7000D (see FIG. 8C). For example, the moth-eye structure ME can have a pillar-like shape or a cone-like shape. Thus, reflection of light which enters the surface of the optical element 7000D can be suppressed. Furthermore, light which enters the optical element 7000D can be effectively used.

For example, a curved surface functioning as a lens, an inclined surface functioning as a prism, or the like can be formed in the region OD1, the region OD2, or the region OD3 by a lithography method, a nanoimprint method, or the like. Alternatively, the moth-eye structure ME or the like can be formed in the region OD1, the region OD2, or the region OD3 by a lithography method, a nanoimprint method, or the like. The moth-eye structure ME or the like can be formed in the region OD1, the region OD2, or the region OD3 using a mold formed by a lithography method, a nanoimprint method, or the like.

Calculation results of the effect of the optical elements are described with reference to FIGS. 21A, 21B, 21C, 21D, and 21E.

Figure 21A:
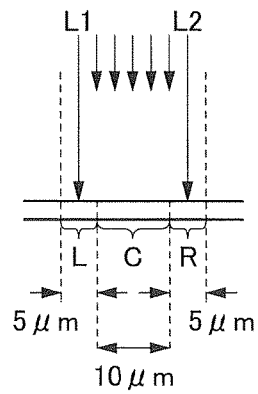
FIGS. 21A, 21B, 21C, 21D, and 21E are schematic views illustrating effects of optical elements of a display device of one embodiment.

FIG. 21A is a schematic view illustrating the state where external light enters a predetermined region. The predetermined region includes a region L with a width of 5 μm, a region C with a width of 10 μm, and a region R with a width of 5 μm.

Figure 21B:
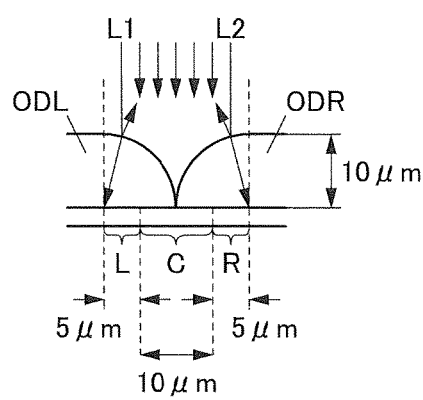
Figure 21C:
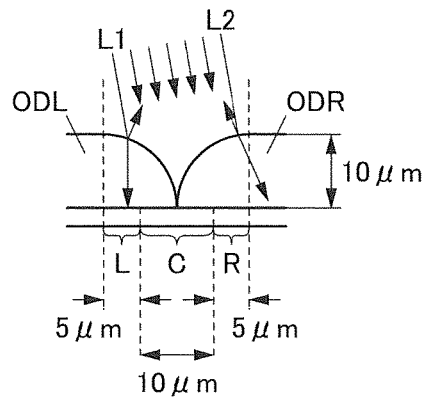

FIG. 21B is a schematic view illustrating the state where external light enters the predetermined region through optical elements ODL and ODR. The optical element ODL includes a region overlapping with the region L and the region C and has a curved surface with a curvature radius of 10 μm at an end portion. The optical element ODR includes a region overlapping with the region R and the region C and has a curved surface with a curvature radius of 10 μm at an end portion. FIG. 21C is a schematic view illustrating the state where external light which enters the structure illustrated in FIG. 21B is inclined by 10°. Note that lenticular lenses are used for the optical elements, and the refractive indexes thereof are 1.7.

Figure 21D:
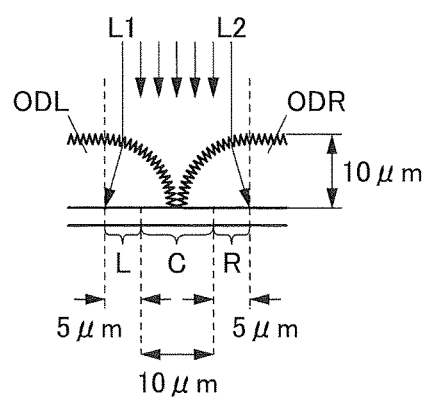
Figure 21E:
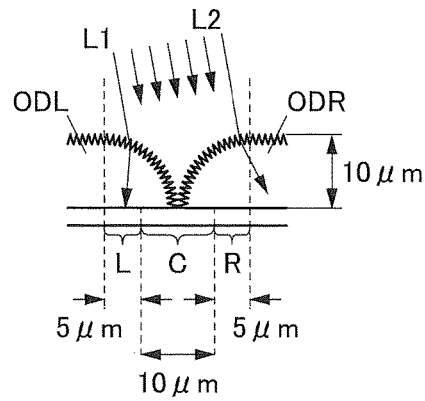

FIG. 21D is a schematic view illustrating the state where external light enters the predetermined region through the optical elements ODL and ODR. Each of the optical elements ODL and ODR has a moth-eye structure on its surface in addition to the above structure. FIG. 21E is a schematic view of the state where external light which enters the structure illustrated in FIG. 21D is inclined by 10°.

In the case where the optical elements are not used, 50% of external light enters the region C and the other 50% thereof enters a combined region of the region L and the region R (see FIG. 21A).

In the case where the optical elements each having no moth-eye structure are used, 16% of external light enters the region C and 72% thereof enters the combined region of the region L and the region R (see FIG. 21B). In the case where external light is inclined by 10°, 14% of the external light enters the region C and 72% thereof enters the combined region of the region L and the region R (see FIG. 21C).

In the case where the optical elements each having a moth-eye structure are used, 18% of external light enters the region C, and 74% thereof enters the combined region of the region L and the region R (see FIG. 21D). In the case where external light is inclined by 10°, 16% of the external light enters the region C and 74% thereof enters the combined region of the region L and the region R (see FIG. 21E). The moth-eye structure provided on each of the surfaces of the optical elements reduces reflection of light and increases the proportion of light which proceeds to the inside of the optical element.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed in the same process as the semiconductor film of the transistor M or the transistor which can be used as the switch SW1 can be used.

As the transistor MD, a transistor having a different structure from the transistor that can be used as the switch SW1 can be used, for example. Specifically, a transistor including the conductive film 524 can be used as the transistor MD (see FIG. 4B).

Note that the transistor MD can have the same structure as the transistor M.

<<Transistor>>

For example, semiconductor films formed at the same step can be used for transistors in the driver circuit and the pixel circuit.

As the transistor in the driver circuit or the pixel circuit, a bottom-gate transistor or a top-gate transistor can be used, for example.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor. In any reconstruction, a conventional manufacturing line can be effectively used.

For example, a transistor including a semiconductor containing an element belonging to Group 14 can be used. Specifically, a semiconductor containing silicon can be used for a semiconductor film. For example, single crystal silicon, polysilicon, microcrystalline silicon, or amorphous silicon can be used for the semiconductor film of the transistor.

Note that the temperature for forming a transistor using polysilicon in a semiconductor is lower than the temperature for forming a transistor using single crystal silicon in a semiconductor.

In addition, the transistor using polysilicon as a semiconductor has higher field-effect mobility than the transistor using amorphous silicon as a semiconductor, and therefore a pixel including the transistor using polysilicon can have a high aperture ratio. Moreover, pixels arranged at high resolution, a gate driver circuit, and a source driver circuit can be formed over the same substrate. As a result, the number of components included in an electronic device can be reduced.

In addition, the transistor using polysilicon in a semiconductor has higher reliability than the transistor using amorphous silicon in a semiconductor.

Alternatively, a transistor including a compound semiconductor can be used. Specifically, a semiconductor containing gallium arsenide can be used for a semiconductor film.

Alternatively, a transistor including an organic semiconductor can be used. Specifically, an organic semiconductor containing any of polyacenes and graphene can be used for the semiconductor film.

For example, a transistor using an oxide semiconductor for a semiconductor film can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor in a semiconductor film can be used.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, further preferably less than once per minute while flickering is suppressed. Consequently, eyestrain on a user of the data processor can be reduced, and power consumption for driving can be reduced.

For example, a transistor including the semiconductor film 508, a conductive film 504, the conductive film 512A, and the conductive film 512B can be used as the switch SW1 (see FIG. 5B). The insulating film 506 includes a region positioned between the semiconductor film 508 and the conductive film 504.

The conductive film 504 includes a region overlapping with the semiconductor film 508. The conductive film 504 functions as a gate electrode. The insulating film 506 functions as a gate insulating film.

The conductive films 512A and 512B are electrically connected to the semiconductor film 508. The conductive film 512A has one of a function of a source electrode and a function of a drain electrode, and the conductive film 512B has the other.

Furthermore, a transistor including the conductive film 524 can be used as the transistor included in the driver circuit or the pixel circuit (see FIG. 4B). The conductive film 524 includes a region provided so that the semiconductor film 508 is positioned between the conductive film 524 and the conductive film 504. The insulating film 516 includes a region positioned between the conductive film 524 and the semiconductor film 508. For example, the conductive film 524 can be electrically connected to a wiring supplying the same potential as that supplied to the conductive film 504.

A conductive film in which a 10-nm-thick film containing tantalum and nitrogen and a 300-nm-thick film containing copper are stacked can be used as the conductive film 504, for example. A film containing copper includes a region provided so that a film containing tantalum and nitrogen is positioned between the film containing copper and the insulating film 506.

A material in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region provided so that the film containing silicon, oxygen, and nitrogen is positioned between the film containing silicon and nitrogen and the semiconductor film 508.

A 25-nm-thick film containing indium, gallium, and zinc can be used as the semiconductor film 508, for example.

For example, a conductive film in which a 50-nm-thick film containing tungsten, a 400-nm-thick film containing aluminum, and a 100-nm-thick film containing titanium are stacked in this order can be used as the conductive film 512A or 512B. Note that the film containing tungsten includes a region in contact with the semiconductor film 508.

Note that this embodiment can be combined with any of the other embodiments in this specification as appropriate.

Embodiment 3

In this embodiment, a structure of an input/output device which is one embodiment of the present invention will be described with reference to FIG. 9, FIGS. 10A, 10B1, 10B2, and 10C, FIGS. 11A and 11B, and FIG. 12.

FIG. 9 is a block diagram illustrating a structure of the input/output device of one embodiment of the present invention.

Figure 10A:
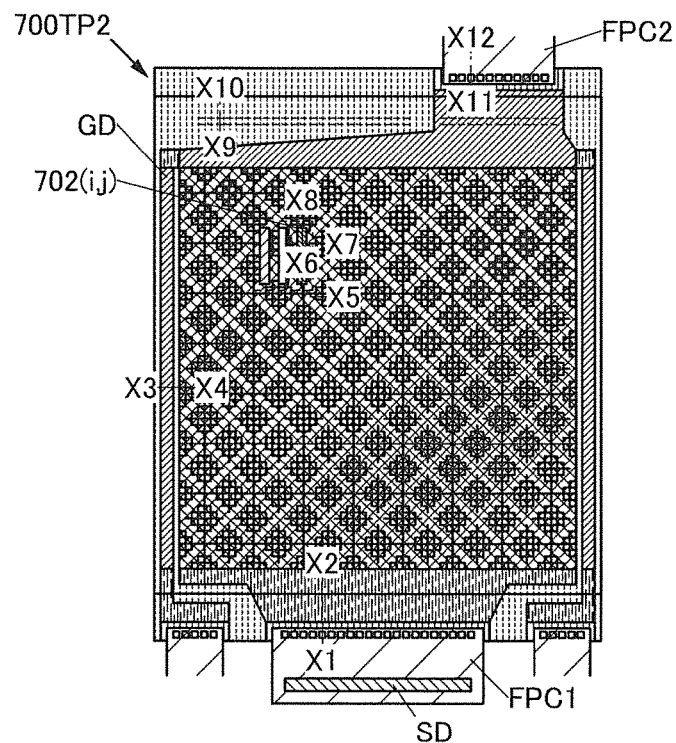
Figures 1, 10B:
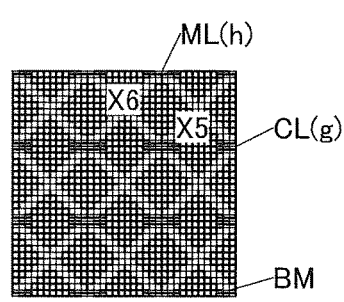
Figures 2, 10B:
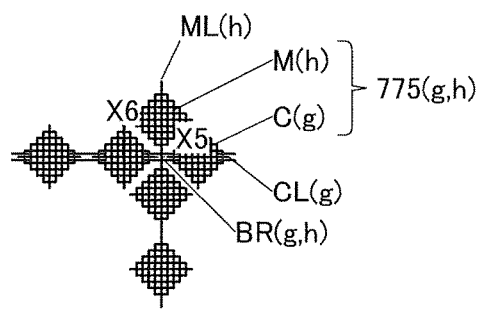
Figure 10C:
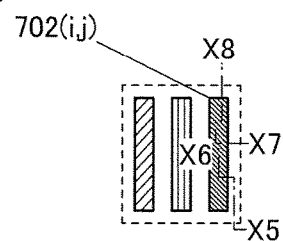

FIGS. 10A, 10B1, 10B2, and 10C illustrate a structure of an input/output panel which can be used for an input/output device of one embodiment of the present invention. FIG. 10A is a top view of the input/output panel. FIG. 10B1 is a schematic diagram illustrating part of an input portion of the input/output panel. FIG. 10B2 is a schematic diagram illustrating part of FIG. 10B1. FIG. 10C is a schematic diagram illustrating a structure of a pixel 702 (*i, j*) which can be used for the input/output device.

Figure 11A:
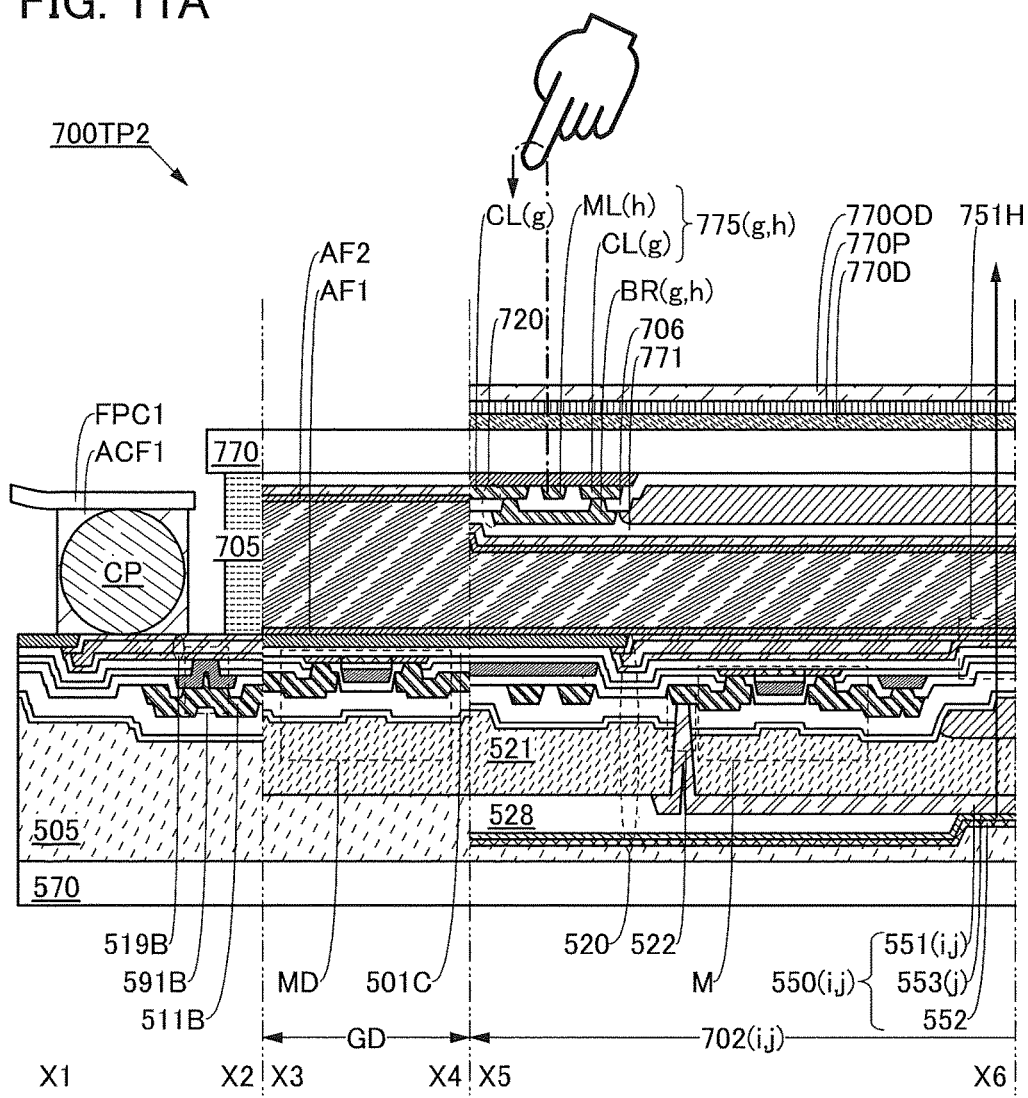
FIGS. 11A and 11B are cross-sectional views illustrating a structure of an input/output panel that can be used in an input/output device of one embodiment.
Figure 11B:
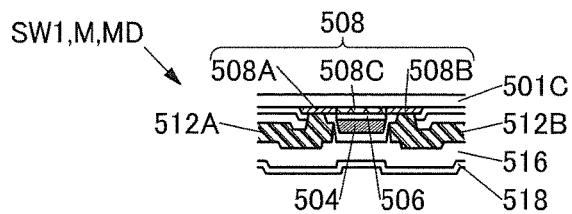
Figure 12:
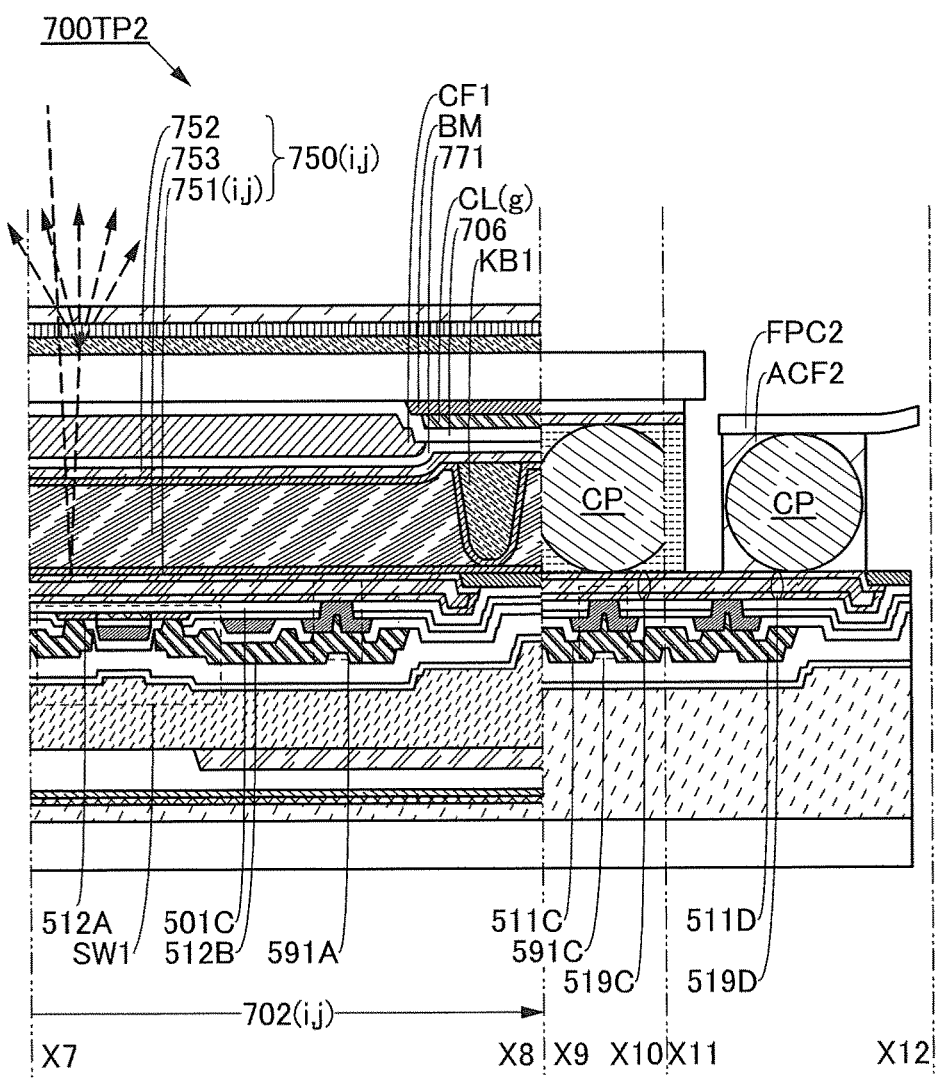
FIG. 12 is a cross-sectional view illustrating a structure of an input/output panel that can be used in an input/output device of one embodiment.

FIGS. 11A and 11B and FIG. 12 illustrate a structure of the input/output panel which can be used in the input/output device of one embodiment of the present invention. FIG. 11A is a cross-sectional view taken along lines X1-X2, X3-X4, and X5-X6 in FIG. 10A. FIG. 11B is a cross-sectional view illustrating part of the structure illustrated in FIG. 11A.

FIG. 12 is a cross-sectional view taken along the cutting plane lines X7-X8, X9-X10, and X11-X12 in FIG. 10A.

<Structural Example of Input/Output Device>

The input/output device illustrated in this embodiment includes a display portion 230 and an input portion 240 (see FIG. 9). Note that the input/output device includes an input/output panel 700TP2.

The input portion 240 includes a sensing region 241. The sensing region 241 includes a region overlapping with the display region 231 of the display portion 230. The sensing region 241 has a function of sensing an object that approaches the region overlapping with the display region 231 (see FIG. 11A).

<<Input Portion 240>>

The input portion 240 includes the sensing region 241, an oscillator circuit OSC, and a sensing circuit DC (see FIG. 9).

The sensing region 241 includes a group consisting of sensing elements 775(*g*, 1) to 775(*g, q*) and another group consisting of sensing elements 775(1, h) to 775(*p, h*) (see FIG. 9). Note that g is an integer greater than or equal to 1 and less than or equal to p, h is an integer greater than or equal to 1 and less than or equal to q, and each of p and q is an integer greater than or equal to 1.

The one group of the sensing elements 775(*g*, 1) to 775(*g, q*) include the sensing element 775(*g, h*) and are arranged in a row direction (indicated by the arrow R2 in the drawing). Note that the direction indicated by the arrow R2 in FIG. 9 may be the same as or different from the direction indicated by the arrow R1 in FIG. 9.

The another group of sensing elements 775(1, h) to 775(*p, h*) include the sensing element 775(*g, h*) and are provided in a column direction (the direction indicated by the arrow C2 in the drawing) that intersects the row direction.

The one group of sensing elements 775(*g*, 1) to 775(*g, q*) provided in the row direction include the electrode C(g) that is electrically connected to the control line CL(g) (see (B2) in FIG. 10).

The another group of sensing elements 775(1, h) to 775(*p, h*) provided in the column direction include the electrode M(h) that is electrically connected to the sensing signal line ML(h).

The control line CL(g) includes a conductive film BR(g, h) (see FIG. 11A). The conductive film BR(g, h) includes a region overlapping with the sensing signal line ML(h).

An insulating film 706 includes a region positioned between the sensing signal line ML(h) and the conductive film BR(g, h). Thus, a short circuit between the sensing signal line ML(h) and the conductive film BR(g, h) can be prevented.

<<Sensing Element 775(g, h)>>

The sensing element 775(g, h) is electrically connected to the control line CL(g) and the sensing signal line ML(h).

The sensing element 775(g, h) has a light-transmitting property. The sensing element 775(g, h) includes an electrode C(g) and an electrode M(h).

For example, a conductive film having an opening in a region overlapping with the pixel 702 (i, j) can be used for the electrode C(g) and the sensing signal line ML(h). Accordingly, an object that approaches the region overlapping with the display panel can be sensed without disturbing display of the display panel. Moreover, the thickness of the input/output device can be reduced. Note that the light-blocking film BM can be used. The light-blocking film BM includes a region overlapping with the electrode C(g) and the sensing signal line ML(h) and a region positioned between the substrate 770 and the electrode C(g) or between the substrate 770 and the sensing signal line ML(h), for example. Thus, the intensity of external light reflected by the sensing element 775(g, h) can be reduced. As a result, a novel input/output device that is highly convenient or reliable can thus be provided.

The electrode C(g) is electrically connected to the control line CL(g).

The electrode M(h) is electrically connected to the sensing signal line ML(h) and is positioned so that an electric field part of which is blocked by an object approaching a region overlapping with the display panel 700 is generated between the electrode M(h) and the electrode C(g).

Note that the control line CL(g) has a function of supplying a control signal.

The sensing signal line ML(h) has a function of receiving the sensing signal.

The sensing element 775(g, h) has a function of supplying a sensing signal which changes in accordance with the control signal and a distance between the sensing element and an object approaching a region overlapping with the display panel 700.

Thus, the object approaching the region overlapping with the display panel can be sensed while the image data is displayed by the display panel. As a result, a novel input/output device with high convenience or high reliability can be provided.

<<Oscillator Circuit OSC>>

The oscillator circuit OSC is electrically connected to the control line CL(g) and has a function of supplying a control signal. For example, a rectangular wave, a sawtooth wave, a triangular wave, or the like can be used as the control signal.

<<Sensing Circuit DC>>

The sensing circuit DC is electrically connected to the sensing signal line ML(h) and has a function of supplying a sensing signal on the basis of a change in the potential of the sensing signal line ML(h). Note that the sensing signal includes positional data P1, for example.

<<Display Portion 230>>

The display device described in Embodiment 1 can be used as the display portion 230, for example.

Figure 18B:
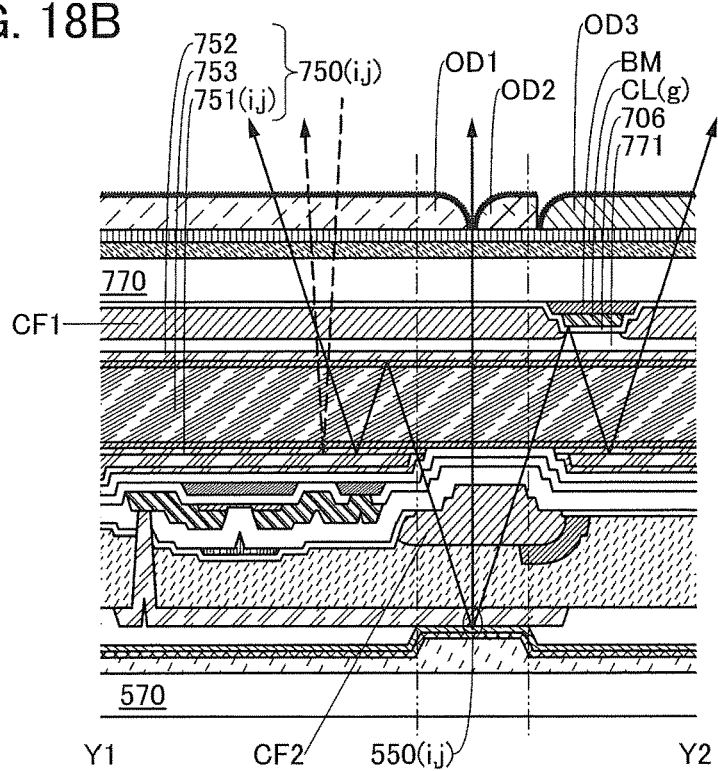

Note that part of light emitted from the second display element 550(i, j) passes through the layer 753 containing a liquid crystal material and is reflected by the control line CL(g), the second electrode 752, or the like in some cases (see FIG. 18B). Reflection is repeated between the second electrode 752 and the first electrode 751 (i, j) in some cases, for example. Alternatively, reflection is repeated between the substrate 770 and the first electrode 751 (i, j) in some cases. Thus, image data can be displayed like indirect lighting with light emitted from the second display element. The second display element can display an image which gives less stress on eyes.

When the first display element 750(i, j) and the second display element 550(i, j) are used for the display of images, the color reflected by an object, the color emitted from an object, and the color of light reflected between the control line CL(g) and the first electrode 751 (i, j), or the like are mixed. Thus, a picture-like image can be displayed.

<<Input/Output Panel 700TP2>>

The input/output panel 700TP2 is different from, for example, the display panel 700 described in Embodiment 2 in that a functional layer 720 and a top-gate transistor are provided. Different structures will be described in detail below, and the above description is referred to for the other similar structures.

<<Functional Layer 720>>

The functional layer 720 includes a region surrounded by the substrate 770, the insulating film 501C, and the sealant 705, for example (see FIGS. 11A and 11B or FIG. 12).

The functional layer 720 includes the control line CL(g), the sensing signal line ML(h), and the sensing element 775(g, h), for example.

In the input/output device, the gap between the control line CL(g) and the second electrode 752 or between the sensing signal line ML(h) and the second electrode 752 is greater than or equal to 0.2 μm and less than or equal to 16 μm, preferably greater than or equal to 1 μm and less than or equal to 8 μm, and further preferably greater than or equal to 2.5 μm and less than or equal to 4 μm.

<<Conductive Film 511D>>

The input/output panel 700TP2 described in this embodiment includes the conductive film 511D (see FIG. 12).

Note that a conductive material CP or the like can be provided between the control line CL(g) and the conductive film 511D to electrically connect the control line CL(g) and the conductive film 511D. Alternatively, the conductive material CP or the like can be provided between the sensing signal line ML(h) and the conductive film 511D to electrically connect the sensing signal line MI(h) and the conductive film 511D. A material that can be used for the wiring or the like can be used for the conductive film 511D, for example.

<<Terminal 519D>>

The input/output panel 700TP2 described in this embodiment includes a terminal 519D. The terminal 519D is electrically connected to the conductive film 511D.

For example, a material that can be used for a wiring or the like can be used for the terminal 519D. Specifically, the terminal 519D can have the same structure as the terminal 519B or the terminal 519C (see FIG. 12).

Note that for example, the terminal 519D can be electrically connected to a flexible printed circuit FPC2 using a conductive material ACF2, for example. Accordingly, a control signal can be supplied to the control line CL(g) using the terminal 519D, or a sensing signal can be supplied from the sensing signal line ML(h) using the terminal 519D, for example.

<<Switch SW1, Transistor M, Transistor MD>>

A transistor that can be used for the switch SW1, the transistor M, and the transistor MD include the conductive film 504 having a region overlapping with the insulating film 501C and the semiconductor film 508 having a region located between the insulating film 501C and the conductive film 504. Note that the conductive film 504 functions as a gate electrode (see FIG. 11B).

The semiconductor film 508 includes a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MD includes the insulating film 506 between the third region 508C and the conductive film 504. Note that the insulating film 506 functions as a gate insulating film.

The first region 508A and the second region 508B have a lower resistivity than the third region 508C, and function as a source region and a drain region.

For example, plasma treatment using a gas containing a rare gas is performed on the oxide semiconductor film, whereby the first region 508A and the second region 508B can be formed in the semiconductor film 508.

For example, the conductive film 504 can be used as a mask. The use of the conductive film 504 as a mask allows the shape of part of the third region 508C to be self-aligned with the shape of an end of the conductive film 504.

The transistor MD includes the conductive film 512A and the conductive film 512B that are in contact with the first region 508A and the second region 508B, respectively. The conductive film 512A and the conductive film 512B function as a source electrode and a drain electrode.

For example, a transistor which can be formed in the same process as the transistor MD can be used as the transistor M.

Note that this embodiment can be combined with any of the other embodiments in this specification as appropriate.

Embodiment 4

In this embodiment, a structure of a data processing device of one embodiment of the present invention will be described with reference to FIGS. 13A to 13C, FIGS. 14A and 14B, and FIG. 15.

Figure 13A:
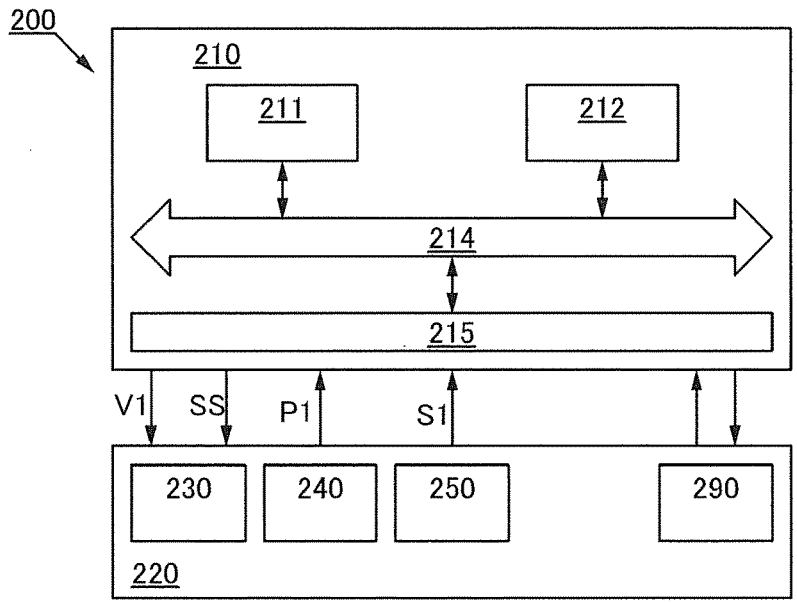
FIGS. 13A to 13C are a block diagram and projection views illustrating structures of a data processing device of one embodiment.
Figure 13B:
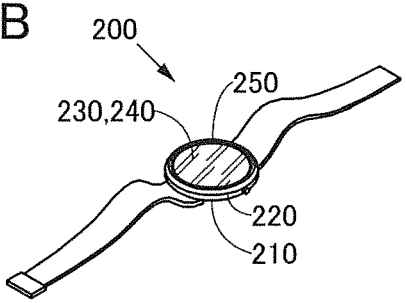
Figure 13C:
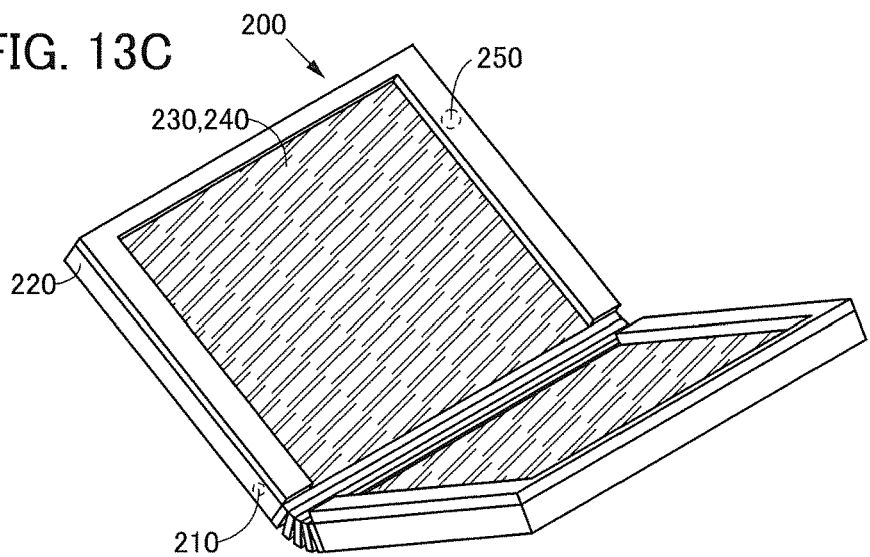

FIG. 13A is a block diagram illustrating a structure of a data processing device 200 of one embodiment of the present invention. FIGS. 13B and 13C are projection views illustrating examples of external views of the data processing device 200.

Figure 14B:
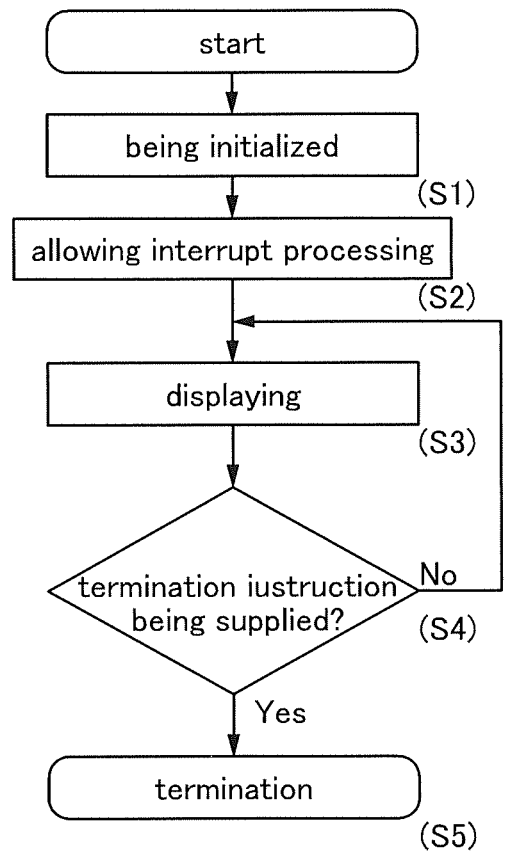
FIGS. 14A and 14B are flow charts illustrating a method for driving a data processing device of one embodiment.
Figure 14A:
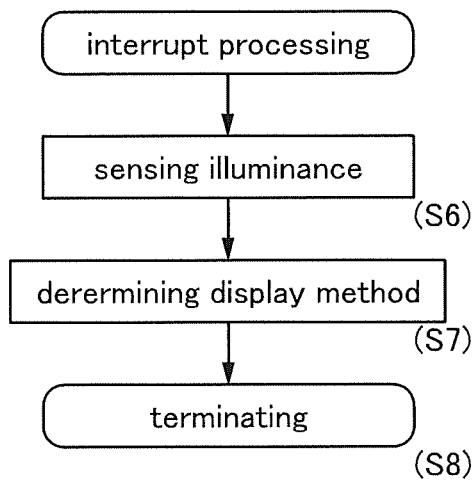

FIGS. 14A and 14B are flow charts illustrating the program of one embodiment of the present invention. FIG. 14A is a flow chart showing main processing of the program of one embodiment of the present invention, and FIG. 14B is a flow chart showing interrupt processing.

Figure 15:
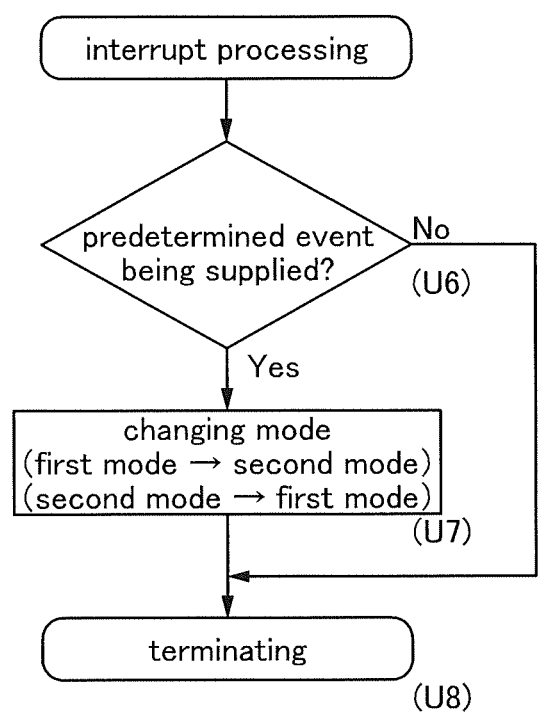
FIG. 15 is a flow chart illustrating a method for driving a data processing device of one embodiment.

FIG. 15 is a flow chart illustrating interrupt processing of the program of one embodiment of the present invention.

<Structure Example 1 of Data Processing Device>

The data processing device 200 described in this embodiment includes an input/output device 220 and an arithmetic device 210 (see FIG. 13A). The input-output device 220 is electrically connected to the arithmetic device 210. The data processing device 200 can include a housing (see FIG. 13B or 13C).

The input/output device 220 includes the display portion 230 and the input portion 240 (see FIG. 13A). The input/output device 220 includes a sensor portion 250. The input/output device 220 can include a communication portion 290.

The input/output device 220 has a function of receiving the image data V1 or the control data SS and a function of supplying the positional data P1 or the sensing data S1.

The arithmetic device 210 has a function of receiving the positional data P1 or the sensing data S1. The arithmetic device 210 has a function of supplying the image data V1. For example, the arithmetic device 210 has a function of operating on the basis of the positional data P1 or the sensing data S1.

Note that the housing has a function of storing the input/output device 220 or the arithmetic device 210. Alternatively, the housing has a function of supporting the display portion 230 or the arithmetic device 210.

The display portion 230 has a function of displaying an image on the basis of the image data V1. The display portion 230 has a function of displaying an image on the basis of the control data SS.

The input portion 240 has a function of supplying the positional data P1.

The sensor portion 250 has a function of supplying the sensing data S1. The sensor portion 250 has a function of sensing the illuminance of the environment where the data processing device 200 is used and a function of supplying illuminance data, for example.

Thus, the data processing device can identify the intensity of light received by the housing of the data processing device and operate under a usage environment. As a result, a novel data processing device with high convenience or high reliability can be provided.

Accordingly, the user of the data processing device can select a display method.

Specifically, when the display method using the first display element is selected, power consumption can be reduced, for example. Alternatively, when the display method using the second display element is selected, display can be performed in a dark place, for example. As a result, a novel data processing device with high convenience or high reliability can be provided.

Individual components included in the data processing device will be described below. Note that these components cannot be clearly distinguished and one component may also serve as another component or include part of another component. For example, a touch panel in which a touch sensor is provided so as to overlap with a display panel serves as an input portion as well as a display portion.

Structure Example

The data processing device 200 of one embodiment of the present invention includes a housing or the arithmetic device 210.

The arithmetic device 210 includes an arithmetic portion 211, a memory portion 212, a transmission path 214, or an input/output interface 215.

The data processing device of one embodiment of the present invention includes the input/output device 220.

The input/output device 220 includes the display portion 230, the input portion 240, the sensor portion 250, and the communication portion 290.

<<Data Processing Device>>

The data processing device of one embodiment of the present invention includes the arithmetic device 210 or the input/output device 220.

<<Arithmetic Device 210>>

The arithmetic device 210 includes an arithmetic portion 211 and a memory portion 212. The arithmetic device 210 further includes the transmission path 214 and the input/output interface 215.

<<Arithmetic Portion 211>>

The arithmetic portion 211 is configured to, for example, execute a program.

<<Memory Portion 212>>

The memory portion 212 has a function of, for example, storing the program executed by the arithmetic portion 211, initial data, setting data, an image, or the like.

Specifically, a hard disk, a flash memory, a memory including a transistor including an oxide semiconductor, or the like can be used for the memory portion 212.

<<Input/Output Interface 215, Transmission Path 214>>

The input/output interface 215 includes a terminal or a wiring and is configured to supply and receive data. For example, the input/output interface 215 can be electrically connected to the transmission path 214 and the input/output device 220.

The transmission path 214 includes a wiring and is configured to supply and receive data. For example, the transmission path 214 can be electrically connected to the input/output interface 215. In addition, the transmission path 214 can be electrically connected to the arithmetic portion 211, the memory portion 212, or the input/output interface 215.

<<Input/Output Device 220>>

The input/output device 220 includes the display portion 230, the input portion 240, the sensor portion 250, or the communication portion 290. For example, the input/output device described in Embodiment 3 can be used. Accordingly, power consumption can be reduced.

<<Display Portion 230>>

The display portion 230 includes the control portion 238, a driving circuit GD, a driving circuit SD, and the display panel 700 (see FIG. 1). For example, the display device described in Embodiment 1 can be used as the display portion 230.

<<Input Portion 240>>

A variety of human interfaces or the like can be used as the input portion 240 (see FIG. 13A to 13C).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel or a touch screen.

For example, a user can make various gestures (e.g., tap, drag, swipe, and pinch in) using his/her finger as a pointer on the touch panel.

The arithmetic device 210, for example, analyzes data on the position, track, or the like of the finger on the touch panel and determines that a specific gesture is supplied when the analysis results meet predetermined conditions. Therefore, the user can supply a predetermined operation instruction associated with a predetermined gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 has a function of sensing the surroundings and supplying the sensing data such as illuminance data, attitude data, pressure data, and positional data.

For example, a photosensor, an attitude sensor, an acceleration sensor, a direction sensor, a global positioning system (GPS) signal receiving circuit, a pressure sensor, a temperature sensor, a humidity sensor, a camera, or the like can be used as the sensor portion 250.

<<Communication Portion 290>>

The communication portion 290 is configured to supply and acquire data to/from a network.

<<Program>>

The program of one embodiment of the present invention has the following steps (see FIG. 14A).

[First Step]

In a first step, setting is initialized (see S1 in FIG. 14A).

For example, predetermined image data which is to be displayed on start-up and data for identifying a predetermined mode of displaying the image data and a predetermined method of displaying the image data are acquired from the memory portion 212. Specifically, one still image data or another moving image data can be used as the predetermined image data. Furthermore, a first mode or a second mode can be used as the predetermined mode. Furthermore, a first display method, a second display method, or a third display method can be used as the predetermined display method.

[Second Step]

In the second step, interrupt processing is permitted (see S2 in FIG. 14A). Note that an arithmetic device allowed to execute the interrupt processing can perform the interrupt processing in parallel with the main processing. The arithmetic device that has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

[Third Step]

In a third step, image data is displayed in the predetermined mode or the predetermined display method selected in the first step or the interrupt processing (see S3 in FIG. 14A). Note that the predetermined mode identifies a mode for displaying the image data, and the predetermined display method identifies a method for displaying the image data. For example, the image data V1, the data V11, or the data V12 can be used for data to be displayed, for example.

For example, a method for displaying the image data V1 can be associated with the first mode. Another method for displaying the image data V1 can be associated with the second mode. Thus, a display method can be selected on the basis of the selected mode.

For example, three different methods for displaying the image data V1 can be associated with the first display method to the third display method. Thus, display can be performed on the basis of the selected display method.

<<First Mode>>

Specifically, a method of supplying selection signals to a scan line at a frequency of 30 Hz or more, preferably 60 Hz or more, and displaying an image in accordance with the selection signals can be associated with the first mode.

For example, the supply of selection signals at a frequency of 30 Hz or more, preferably 60 Hz or more, can display a smooth moving image.

For example, an image is refreshed at a frequency of 30 Hz or more and preferably 60 Hz or more, so that an image smoothly following the user's operation can be displayed on the data processing device 200 the user operates.

<<Second Mode>>

Specifically, a method of supplying selection signals to a scan line at a frequency of less than 30 Hz, preferably less than 1 Hz, further preferably once a minute and displaying an image in accordance with the selection signals can be associated with the second mode.

The supply of selection signals at a frequency of less than 30 Hz, preferably less than 1 Hz, more preferably once a minute, can perform display with flickers reduced. Furthermore, power consumption can be reduced.

For example, when the data processing device 200 is used for a clock or watch, the display can be refreshed at a frequency of once a second, once a minute, or the like.

For example, when a light-emitting element is used as the second display element, the light-emitting element can be configured to emit light in a pulsed manner so as to display image data. Specifically, an organic EL element can be configured to emit light in a pulsed manner, and its afterglow can be used for display. The organic EL element has excellent frequency characteristics; thus, time for driving the light-emitting element can be shortened, and thus power consumption can be reduced in some cases. Alternatively, heat generation can be inhibited, and thus the deterioration of the light-emitting element can be suppressed in some cases.

<<First Display Method>>

Specifically, a method in which the first display element 750($i, j$) is used to display image data can be used as the first display method. Thus, for example, the power consumption can be reduced. In addition, image data with high contrast can be favorably displayed in a bright environment.

<<Second Display Method>>

Specifically, a method in which the second display element 550($i, j$) is used to display image data can be used as the second display method. Thus, for example, an image can be favorably displayed in a dark environment. Furthermore, a photograph and the like can be displayed with favorable color reproducibility. In addition, a moving image which moves quickly can be displayed smoothly.

In the case where the image data V1 is displayed using the second display element 550($i, j$), brightness for displaying the image data V1 can be determined on the basis of illuminance data. For example, when illuminance is higher than or equal to 5,000 lux and less than 100,000 lux, the image data V1 is displayed using the second display element 550($i, j$) to be brighter than the case where the illuminance is less than 5,000 lux.

<<Third Display Method>>

Specifically, a method in which the first display element 750($i, j$) and the second display element 550($i, j$) are used to display image data can be used as the third display method. In that case, power consumption can be reduced. Thus, for example, an image can be favorably displayed in a dark environment. Furthermore, a photograph and the like can be displayed with favorable color reproducibility. In addition, a moving image which moves quickly can be displayed smoothly.

Note that a function of adjusting the brightness of display by using the first display element 750($i, j$) and the second display element 550($i, j$) for display can be referred to as a light adjusting function. For example, the brightness of a reflective display element can be compensated using the display element having a function of emitting light.

Note that a function of adjusting the color of display by using the first display element 750($i, j$) and the second display element 550($i, j$) can be referred to as a color adjusting function. For example, the color of a reflective display element can be changed using the display element having a function of emitting light. Specifically, the use of a blue organic EL element can make a yellowish color displayed by the reflective liquid crystal element closer to white. Thus, text data can be displayed like texts printed on a plain paper, for example. Furthermore, an eye-friendly display can be achieved.

When the first display element 750($i, j$) and the second display element 550($i, j$) are used for display, the color reflected by an object and the color emitted from an object are mixed. Thus, a picture-like image can be displayed.

[Fourth Step]

In the fourth step, the program moves to the fifth step when a termination instruction is supplied, and the program moves to the third step when the termination instruction is not supplied (see S4 in FIG. 14A).

For example, the termination instruction supplied in the interrupt processing can be used to determine the next step.

[Fifth Step]

In the fifth step, the program terminates (see S5 in FIG. 14A).

<<Interrupt Processing>>

The interrupt processing includes sixth to eighth steps described below (see FIG. 14B).

[Sixth Step]

In the sixth step, the illuminance of the environment where the data processing device 200 is used can be sensed using the sensor portion 250, for example (see S6 in FIG. 14B). Note that color temperature or chromaticity of ambient light can be sensed instead of the illuminance of the environment.

[Seventh Step]

In the seventh step, a display method is determined on the basis of the sensed illuminance data. For example, the first display method is determined when the illuminance is greater than or equal to the predetermined value, whereas the second display method is determined when the illuminance is less than the predetermined value. Furthermore, the display method may be determined to be the third display method when the illuminance is within a predetermined range (see S7 in FIG. 14B).

Specifically, in the case where the illuminance is greater than or equal to 100,000 lux, the display method may be determined to be the first display method. In the case where the illuminance is less than 5,000 lux, the display method may be determined to be the second display method. In the case where the illuminance is greater than or equal to 5,000 lux and less than 100,000 lux, the display method may be determined to be the third display method.

In the case where color temperature or chromaticity of the ambient light is sensed in the sixth step, the color of display may be adjusted using the second display element 550($i, j$) by the third display method.

For example, the first-status control data SS is supplied when the first display method is used, the second-status control data SS is supplied when the second display method is used, and the third-status control data SS is supplied when the third display method is used.

[Eighth Step]

In the eighth step, the interrupt processing terminates (see S8 in FIG. 14B).

<Structure Example 2 of Data Processing Device>

Another structure of a data processing device of one embodiment of the present invention will be described with reference to FIG. 15.

FIG. 15 is a flow chart illustrating the program of one embodiment of the present invention. The interrupt processing in the flow chart in FIG. 15 is different from that in FIG. 14B.

Note that a structure example 2 of the data processing device is different from the interrupt processing in FIG. 14B in that the interrupt processing includes a step in which a mode is changed on the basis of supplied predetermined event. Different structures are described in detail below, and the above description is referred to for the other similar structures.

<<Interrupt Processing>>

The interrupt processing includes sixth to eighth steps described below (see FIG. 15).

[Sixth Step]

In the sixth step, the processing proceeds to the seventh step when a predetermined event has been supplied, whereas the processing proceeds to the eighth step when the predetermined event has not been supplied (see U6 in FIG. 15). For example, whether the predetermined event is supplied in a predetermined period or not can be a branch condition. Specifically, the predetermined period can be longer than 0 seconds and shorter than or equal to 5 seconds, preferably shorter than or equal to 1 second, further preferably shorter than or equal to 0.5 seconds, still further preferably shorter than or equal to 0.1 seconds.

[Seventh Step]

In the seventh step, the mode is changed (see U7 in FIG. 15). Specifically, the mode is changed to the second mode when the first mode has been selected, or the mode is changed to the first mode when the second mode has been selected.

[Eighth Step]

In the eighth step, the interrupt processing is completed (see U8 in FIG. 15). Note that in a period in which the main processing is executed, the interrupt processing may be repeatedly executed.

<<Predetermined Event>>

The following events can be used, for example: events supplied using a pointing device such as a mouse (e.g., "click" and "drag") and events supplied to a touch panel with a finger or the like used as a pointer (e.g., "tap", "drag", or "swipe").

Furthermore, for example, the position of a slide bar pointed by a pointer, the swipe speed, and the drag speed can be used as parameters assigned to an instruction associated with the predetermined event.

For example, data sensed by the sensor portion 250 is compared to a predetermined threshold value, and the compared results can be used for the event.

Specifically, a pressure sensor or the like in contact with a button or the like that can be pushed in a housing can be used as the sensor portion 250.

<<Instruction Associated with Predetermined Event>>

The termination instruction can be associated with a predetermined event, for example.

For example, "page-turning instruction" for switching displayed image data from one to another can be associated with a predetermined event. Note that a parameter for determining the page-turning speed or the like when the "page-turning instruction" is executed can be supplied using the predetermined event.

For example, "scroll instruction" for moving the display position of part of image data and displaying another part continuing from that part can be associated with a predetermined event. Note that a parameter for determining the moving speed of the display position or the like when the "scroll instruction" is executed can be supplied using the predetermined event.

For example, an instruction for setting the display method or an instruction for generating image data can be associated with a predetermined event. Note that a parameter for determining the brightness of a generated image can be associated with a predetermined event. Note that a parameter for determining the brightness of a generated image may be determined on the basis of ambient luminance sensed by the sensor portion 250.

For example, an instruction for acquiring data distributed via a push service using the communication portion 290 can be associated with a predetermined event.

Note that positional data sensed by the sensor portion 250 may be used for the determination of the presence or absence of a qualification for acquiring data. Specifically, it may be determined that there is a qualification for acquiring data when the user is in a predetermined class room, school, conference room, office, or building. For example, educational materials can be fed from a classroom of a school, a university, or the like, so that the data processing device 200 can be used as a schoolbook or the like (see FIG. 13C). Alternatively, materials distributed from a conference room in, for example, a company can be received and used for a conference material.

<Structure Example 3 of Data Processing Device>

In this embodiment, another structure of the data processing device of one embodiment of the present invention will be described with reference to FIG. 19.

Figure 19:
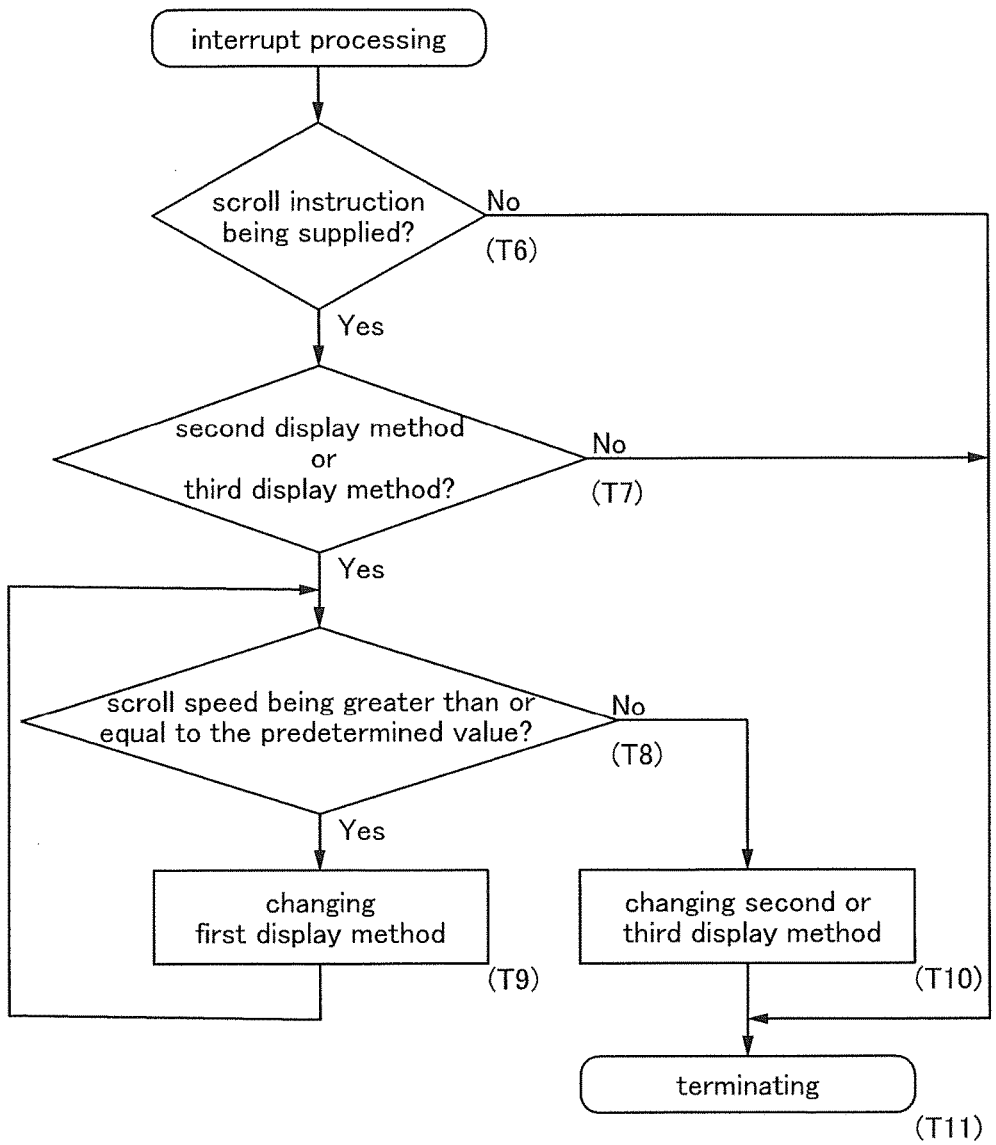
FIG. 19 is a flow chart illustrating a driving method of a data processing device of one embodiment.

FIG. 19 is a flow chart showing the program of one embodiment of the present invention. The interrupt processing in the flow chart in FIG. 19 is different from that in FIG. 14B.

Note that a structure example 3 of the data processing device is different from the interrupt processing in FIG. 14B in that the interrupt processing includes a step in which a display method is changed on the basis of supplied predetermined instruction. Different structures will be described in detail below, and the above description is referred to for the other similar structures.

<<Interrupt Processing>>

The interrupt processing includes the following sixth to eleventh steps (see FIG. 19).

[Sixth Step]

In the sixth step, the processing proceeds to the seventh step when a predetermined instruction has been supplied, whereas the processing proceeds to the eleventh step when the predetermined instruction has not been supplied (see T6 in FIG. 19).

Specifically, a scroll instruction can be used as a predetermined instruction. Alternatively, a page-turning instruction can be used as the predetermined instruction.

[Seventh Step]

In the case where the second display method or the third display method is used in the seventh step, the processing proceeds to the eighth step. In the case where the second display method or the third display method is not used, the processing proceeds to the eleventh step (see T7 in FIG. 19). For example, when the first display method is used, the processing proceeds to the eleventh step.

[Eighth Step]

When the scroll speed is greater than or equal to the predetermined value in the eighth step, the processing proceeds to the ninth step. When the scroll speed is less than the predetermined value in the eighth step, the processing proceeds to the tenth step (see T8 in FIG. 19). For example, the speed at which user's eyes cannot follow images moving when scrolling can be used as a predetermined speed. Thus, images moving at a speed at which user's eyes cannot follow can be displayed by a method different from a method for displaying images moving at a speed at which user's eyes can follow, for example.

In the case where a scroll method in which a scroll speed changes, such as what is called momentum scrolling, whose scroll speed gradually decreases, is used, whether the changing speed is greater than or equal to the predetermined value may be monitored.

[Ninth Step]

In the ninth step, the first display method is used as the display method (see T9 in FIG. 19). For example, a method using the first display element 750(i, j) can be used as the first display method. Specifically, an image can be displayed using a reflective liquid crystal display element. Thus, an image with reduced vividness can be displayed, for example. Furthermore, an image with reduced contrast can be displayed. Furthermore, an eye-friendly display can be achieved. Furthermore, the power consumption can be reduced.

<<Tenth Step>>

In the tenth step, the second display method or the third display method is used as the display method (see T10 in FIG. 19). For example, a method in which the second display element 550(i, j) is used to display image data can be used as the second display method. Specifically, an organic EL element can be used to display image data.

Specifically, a method in which the first display element 750(i, j) and the second display element 550(i, j) are used to display image data can be used as the third display method. Specifically, an image can be displayed using a reflective liquid crystal display element and an organic EL element.

Note that a display method used for determination in the seventh step can be selected. In other words, a display method which is used before the display method is changed to the first method can be selected.

[Eleventh Step]

In the eleventh step, the interrupt processing terminates (see T11 in FIG. 19). Note that in a period in which the main processing is executed, the interrupt processing may be repeatedly executed.

<Structure Example 4 of Data Processing Device>

Another structure of the data processing device of one embodiment of the present invention will be described with reference to FIG. 20.

Figure 20:
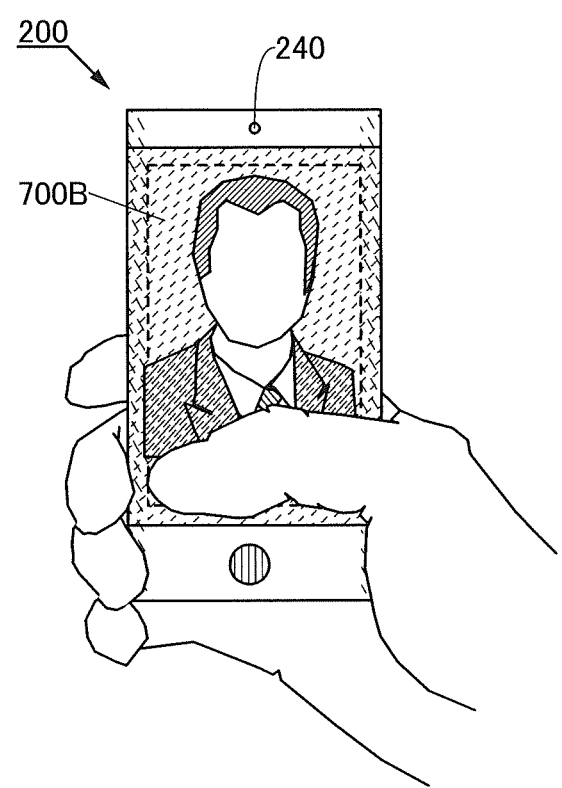
FIG. 20 is a schematic view illustrating a usage state of the data processing device of one embodiment.

FIG. 20 is a schematic view illustrating a use state of the data processing device of one embodiment of the present invention.

The data processing device 200 includes a reflective display element as the first display element 750(i, j). An image with the highest gray level can be displayed on the data processing device 200 using the first display element 750(i, j), for example. Specifically, a white image is displayed. Accordingly, the data processing device 200 can be used like a mirror, for example. Furthermore, a user can adjust clothes.

A camera provided to face toward a user of the data processing device 200 can be used as the input portion 240. Thus, a video obtained by photographing a user of the data processing device 200 can be displayed on the input/output panel 700TP2. Furthermore, the data processing device 200 can be used like a mirror. Furthermore, a user can adjust clothes.

Note that this embodiment can be combined with any of the other embodiments in this specification as appropriate.

Embodiment 5

In this embodiment, electronic devices each of which includes an data processing device of one embodiment of the present invention will be described with reference to FIGS. 16A to 16H.

FIGS. 16A to 16G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 16A:
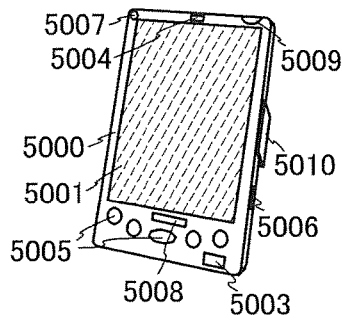
FIGS. 16A to 16H each illustrate a structure of an electronic device of one embodiment.
Figure 16B:
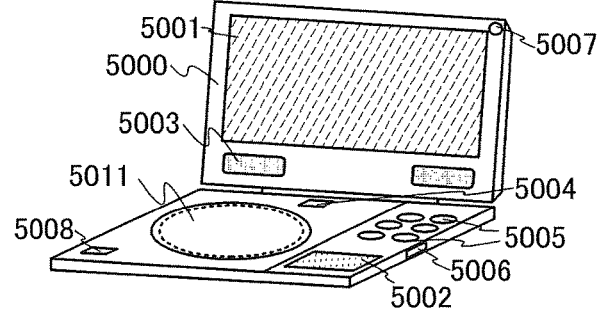
Figure 16C:
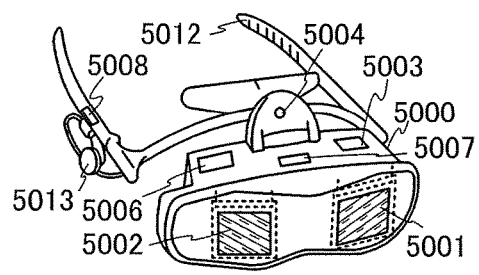
Figure 16D:
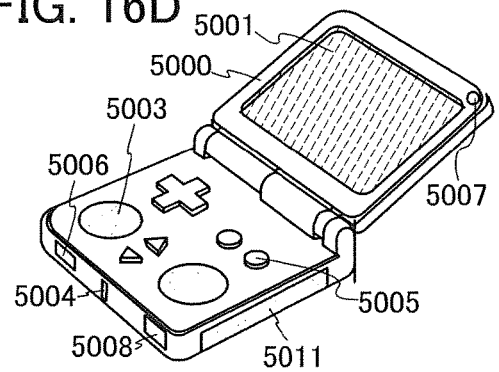
Figure 16E:
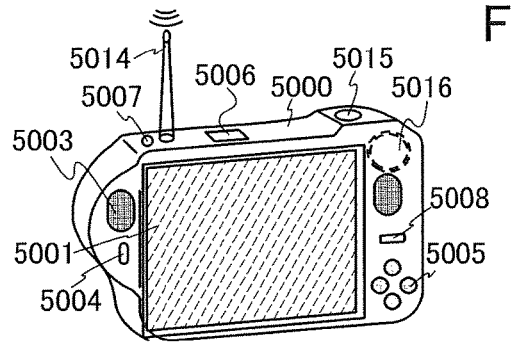
Figure 16F:
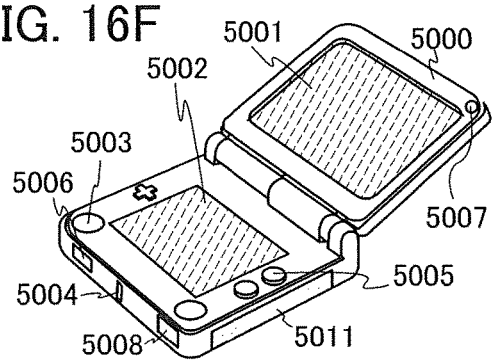
Figure 16G:
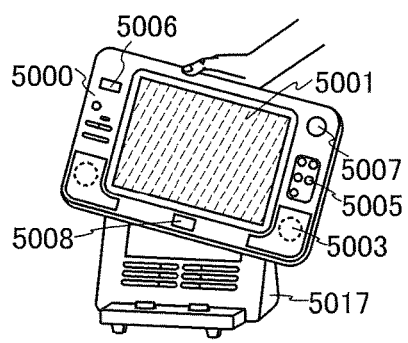

FIG. 16A illustrates a mobile computer that can include a switch 5009, an infrared port 5010, and the like in addition to the above components. FIG. 16B illustrates a portable image reproducing device (e.g., a DVD reproducing device) provided with a recording medium, and the portable image reproducing device can include a second display portion 5002, a recording medium reading portion 5011, and the like in addition to the above components. FIG. 16C illustrates a goggle-type display that can include the second display portion 5002, a support portion 5012, an earphone 5013, and the like in addition to the above components. FIG. 16D illustrates a portable game console that can include the recording medium reading portion 5011 and the like in addition to the above components. FIG. 16E illustrates a digital camera with a television reception function, and the digital camera can include an antenna 5014, a shutter button 5015, an image receiving portion 5016, and the like in addition to the above components. FIG. 16F illustrates a portable game console that can include the second display portion 5002, the recording medium reading portion 5011, and the like in addition to the above components. FIG. 16G illustrates a portable television receiver that can include a charger 5017 capable of transmitting and receiving signals, and the like in addition to the above components.

The electronic devices in FIGS. 16A to 16G can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 16A to 16G are not limited thereto, and the electronic devices can have a variety of functions.

Figure 16H:
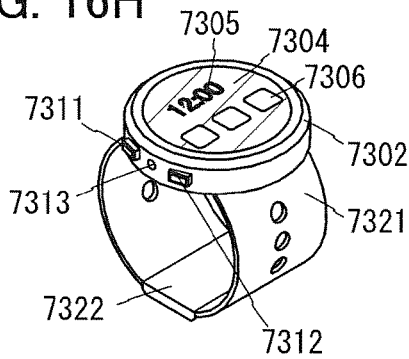

FIG. 16H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 16H can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXPLANATION OF REFERENCE

OD1: region, OD2: region, OD3: region, ME: moth-eye structure, L1: light, L2: light, L3: light, C(g): electrode, M(h): electrode, CL(g): control line, ML(h): sensing signal line, DC: sensing circuit, OSC: oscillator circuit, P1: positional data, BM: light-blocking film, SD: driver circuit, GD: driver circuit, GDA: driver circuit, GDB: driver circuit, CP: conductive material, ANO: conductive film, BR(g, h): conductive film, SS: control data, CSCOM: wiring, ACF1: conductive material, ACF2: conductive material, AF1: alignment film, AF2: alignment film, C11: capacitor, C12: capacitor, CF1: coloring film, CF2: coloring film, G1($i$): scan line, G2($i$): scan line, KB1: structure body, S1: sensing data, S1($j$): signal line, S2($j$): signal line, SD1: driver circuit, SD2: driver circuit, SW1: switch, SW2: switch, V1: image data, V11: data, V12: data, VCOM1: wiring, VCOM2: conductive film, FPC1: flexible printed circuit, FPC2: flexible printed circuit, 200: data processing device, 210: arithmetic device, 211: arithmetic portion, 212: memory portion, 214: transmission path, 215: input/output interface, 220: input/output device, 230: display portion, 231: display region, 234: expansion circuit, 235M: image processing circuit, 235M(1): region, 235M(2): region, 238: control portion, 240: input portion, 241: sensing region, 250: sensor portion, 290: communication portion, 501B: insulating film, 501C: insulating film, 504: conductive film, 505: bonding layer, 506: insulating film, 508: semiconductor film, 508A: region, 508B: region, 508C: region, 511B: conductive film, 511C: conductive film, 511D: conductive film, 512A: conductive film, 512B: conductive film, 516: insulating film, 518: insulating film, 519B: terminal, 519C: terminal, 519D: terminal, 520: functional layer, 521: insulating film, 522: connection portion, 524: conductive film, 528: insulating film, 530($i$, $j$): pixel circuit, 550($i$, $j$): display element, 551: electrode, 552: electrode, 553($j$): layer containing a light-emitting material, 570: substrate, 591A: opening, 591C: opening, 592A: opening, 592B: opening, 592C: opening, 700: display panel, 700B: display panel, 7000D: optical element, 700TP2: input/output panel, 702($i$, $j$): pixel, 705: sealing material, 706: insulating film, 720: functional layer, 750($i$, $j$): display element, 751($i$, $j$): electrode, 751($i$, $j$)b: film, 751H: region, 752: electrode, 753: layer containing a liquid crystal material, 770: substrate, 770D: functional film, 770P: functional film, 771: insulating film, 775: sensing element, 5000: housing, 5001: display portion, 5002: display portion, 5003: speaker, 5004: LED lamp, 5005: operation keys, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation buttons, 7312: operation buttons, 7313: connection terminal, 7321: band, and 7322: clasp.

This application is based on Japanese Patent Application serial no. 2016-140018 filed with Japan Patent Office on Jul. 15, 2016, the entire contents of which are hereby incorporated by reference.

The invention claimed is:
1. A display device comprising:
a display panel; and
a control portion,
wherein the control portion is configured to receive image data and control data,
wherein the control portion is configured to generate first data and second data on the basis of the image data,
wherein the control portion is configured to supply the first data and the second data,
wherein the display panel is configured to receive the first data and the second data,
wherein the display panel comprises a pixel and an optical element,
wherein the pixel comprises a first display element and a second display element,
wherein the second display element comprises a region adjacent to the first display element,
wherein the optical element comprises a first region overlapping with the second display element, wherein the first region is configured to direct light which enters the first region overlapping with the second display element to the first display element,
wherein the first display element is configured to display an image on the basis of the first data,
wherein the first display element is a reflective display element,
wherein the second display element is configured to display an image on the basis of the second data, and
wherein the second display element is a light-emitting element.

2. The display device according to claim 1, wherein the optical element has a moth-eye structure on a surface.

3. The display device according to claim 1,
wherein the pixel comprises a first conductive film, a second conductive film, an insulating film, a pixel circuit, the first display element, and the second display element,
wherein the second conductive film comprises a region overlapping with the first conductive film,
wherein the insulating film comprises a region positioned between the first conductive film and the second conductive film,
wherein the insulating film comprises an opening,
wherein the first conductive film is electrically connected to the first display element,
wherein the second conductive film is electrically connected to the first conductive film in the opening,
wherein the second conductive film is electrically connected to the pixel circuit,
wherein the second display element is electrically connected to the pixel circuit,
wherein the second display element is configured to emit light toward the insulating film, and
wherein the second display element is provided so that display using the second display element can be seen from part of a region from which display using the first display element can be seen.

4. The display device according to claim 1,
wherein the display panel comprises one group of pixels, another group of pixels, a scan line, and a signal line,
wherein the one group of pixels include the pixel,
wherein the one group of pixels are arranged in a row direction,
wherein the another group of pixels include the pixel,
wherein the another group of pixels are arranged in a column direction that intersects the row direction,
wherein the scan line is electrically connected to the one group of pixels, and
wherein the signal line is electrically connected to the another group of pixels.

5. An input/output device comprising:
the display device according to claim 1; and
an input portion,
wherein the input portion is configured to sense an object that approaches a region overlapping with the display panel.

6. The input/output device according to claim 5,
wherein the input portion comprises a region overlapping with the display panel,
wherein the input portion comprises a control line, a sensing signal line, and a sensing element,
wherein the control line is configured to supply a control signal,
wherein the sensing signal line is configured to receive a sensing signal,
wherein the sensing element is electrically connected to the control line and the sensing signal line,
wherein the sensing element has a light-transmitting property
wherein the sensing element comprises a first electrode and a second electrode,
wherein the first electrode is electrically connected to the control line,
wherein the second electrode is electrically connected to the sensing signal line
wherein the second electrode is provided so that an electric field part of which is blocked by an object approaching the region overlapping with the display panel is generated between the second electrode and the first electrode,
wherein the sensing element is configured to supply the sensing signal which changes in accordance with the control signal and a distance between the sensing element and an object approaching a region overlapping with the display panel.

7. A data processing device comprising:
at least one of a keyboard, a hardware button, a pointing device, a touch sensor, an illuminance sensor, an imaging device, an audio input device, a viewpoint input device, and a posture determination device; and
the display device according to claim 1.

8. A display device comprising:
a display panel; and
a control portion,
wherein the control portion is configured to receive image data and control data,
wherein the control portion is configured to generate first data and second data on the basis of the image data,
wherein the control portion is configured to supply the first data and the second data,
wherein the display panel is configured to receive the first data and the second data,
wherein the display panel comprises a pixel and an optical element,
wherein the pixel comprises a first display element, a second display element, and a coloring film,
wherein the second display element comprises a region overlapping with or adjacent to the first display element,
wherein the coloring film comprises a region adjacent to the second display element,
wherein the optical element comprises a second region overlapping with the second display element,
wherein the second region is configured to direct light which enters the second region overlapping with the second display element to the coloring film,
wherein the first display element is configured to display an image on the basis of the first data,
wherein the first display element is a reflective display element,
wherein the second display element is configured to display an image on the basis of the second data, and
wherein the second display element is a light-emitting element.

9. The display device according to claim 8, wherein the second region is shaped so as not to block light which enters the first display element.

10. The display device according to claim 8, wherein the optical element has a moth-eye structure on a surface.

11. The display device according to claim 8,
wherein the pixel comprises a first conductive film, a second conductive film, an insulating film, a pixel circuit, the first display element, and the second display element,
wherein the second conductive film comprises a region overlapping with the first conductive film,
wherein the insulating film comprises a region positioned between the first conductive film and the second conductive film,
wherein the insulating film comprises an opening,
wherein the first conductive film is electrically connected to the first display element,
wherein the second conductive film is electrically connected to the first conductive film in the opening,
wherein the second conductive film is electrically connected to the pixel circuit,
wherein the second display element is electrically connected to the pixel circuit,
wherein the second display element is configured to emit light toward the insulating film, and
wherein the second display element is provided so that display using the second display element can be seen from part of a region from which display using the first display element can be seen.

12. The display device according to claim 8,
wherein the display panel comprises one group of pixels, another group of pixels, a scan line, and a signal line,
wherein the one group of pixels include the pixel,
wherein the one group of pixels are arranged in a row direction,
wherein the another group of pixels include the pixel,
wherein the another group of pixels are arranged in a column direction that intersects the row direction,
wherein the scan line is electrically connected to the one group of pixels, and
wherein the signal line is electrically connected to the another group of pixels.

13. An input/output device comprising:
the display device according to claim 8; and
an input portion,
wherein the input portion is configured to sense an object that approaches a region overlapping with the display panel.

14. The input/output device according to claim 13,
wherein the input portion comprises a region overlapping with the display panel,
wherein the input portion comprises a control line, a sensing signal line, and a sensing element,
wherein the control line is configured to supply a control signal,
wherein the sensing signal line is configured to receive a sensing signal,
wherein the sensing element is electrically connected to the control line and the sensing signal line,
wherein the sensing element has a light-transmitting property
wherein the sensing element comprises a first electrode and a second electrode,
wherein the first electrode is electrically connected to the control line,
wherein the second electrode is electrically connected to the sensing signal line
wherein the second electrode is provided so that an electric field part of which is blocked by an object approaching the region overlapping with the display panel is generated between the second electrode and the first electrode,
wherein the sensing element is configured to supply the sensing signal which changes in accordance with the control signal and a distance between the sensing element and an object approaching a region overlapping with the display panel.

15. A data processing device comprising:
at least one of a keyboard, a hardware button, a pointing device, a touch sensor, an illuminance sensor, an imaging device, an audio input device, a viewpoint input device, and a posture determination device; and
the display device according to claim 8.

16. A display device comprising:
a display panel; and
a control portion,
wherein the control portion is configured to receive image data and control data,
wherein the control portion is configured to generate first data and second data on the basis of the image data,
wherein the control portion is configured to supply the first data and the second data,
wherein the display panel is configured to receive the first data and the second data,
wherein the display panel comprises a pixel and an optical element,
wherein the pixel comprises a first display element, a second display element, and a coloring film,
wherein the coloring film comprises a region adjacent to the first display element,
wherein the optical element comprises a third region overlapping with the coloring film,
wherein the third region is configured to direct external light directed to the third region overlapping with the coloring film to the first display element,
wherein the first display element is configured to display an image on the basis of the first data,
wherein the first display element is a reflective display element,
wherein the second display element is configured to display an image on the basis of the second data, and
wherein the second display element is a light-emitting element.

17. The display device according to claim 16, wherein the optical element has a moth-eye structure on a surface.

18. The display device according to claim 16,
wherein the pixel comprises a first conductive film, a second conductive film, an insulating film, a pixel circuit, the first display element, and the second display element,
wherein the second conductive film comprises a region overlapping with the first conductive film,
wherein the insulating film comprises a region positioned between the first conductive film and the second conductive film,
wherein the insulating film comprises an opening,
wherein the first conductive film is electrically connected to the first display element,
wherein the second conductive film is electrically connected to the first conductive film in the opening,
wherein the second conductive film is electrically connected to the pixel circuit,
wherein the second display element is electrically connected to the pixel circuit,
wherein the second display element is configured to emit light toward the insulating film, and wherein the second display element is provided so that display using the second display element can be seen from part of a region from which display using the first display element can be seen.

19. The display device according to claim 16,
wherein the display panel comprises one group of pixels, another group of pixels, a scan line, and a signal line,
wherein the one group of pixels include the pixel,
wherein the one group of pixels are arranged in a row direction,
wherein the another group of pixels include the pixel,
wherein the another group of pixels are arranged in a column direction that intersects the row direction,
wherein the scan line is electrically connected to the one group of pixels, and
wherein the signal line is electrically connected to the another group of pixels.

20. An input/output device comprising:
the display device according to claim 16; and
an input portion,
wherein the input portion is configured to sense an object that approaches a region overlapping with the display panel.

21. The input/output device according to claim 20,
wherein the input portion comprises a region overlapping with the display panel,
wherein the input portion comprises a control line, a sensing signal line, and a sensing element,
wherein the control line is configured to supply a control signal,
wherein the sensing signal line is configured to receive a sensing signal,
wherein the sensing element is electrically connected to the control line and the sensing signal line,
wherein the sensing element has a light-transmitting property
wherein the sensing element comprises a first electrode and a second electrode,
wherein the first electrode is electrically connected to the control line,
wherein the second electrode is electrically connected to the sensing signal line
wherein the second electrode is provided so that an electric field part of which is blocked by an object approaching the region overlapping with the display panel is generated between the second electrode and the first electrode,
wherein the sensing element is configured to supply the sensing signal which changes in accordance with the control signal and a distance between the sensing element and an object approaching a region overlapping with the display panel.

22. A data processing device comprising:
at least one of a keyboard, a hardware button, a pointing device, a touch sensor, an illuminance sensor, an imaging device, an audio input device, a viewpoint input device, and a posture determination device; and
the display device according to claim 16.

* * * * *